United States Patent
Palacios et al.

(10) Patent No.: US 10,439,059 B2
(45) Date of Patent: Oct. 8, 2019

(54) HIGH-LINEARITY TRANSISTORS

(71) Applicant: Massachusetts Institute of Technology, Cambridge, MA (US)

(72) Inventors: Tomas Apostol Palacios, Belmont, MA (US); Sameer Jayanta-Joglekar, Cambridge, MA (US); Ujwal Radhakrishna, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 15/849,219

(22) Filed: Dec. 20, 2017

(65) Prior Publication Data

US 2018/0197999 A1  Jul. 12, 2018

Related U.S. Application Data

(60) Provisional application No. 62/436,511, filed on Dec. 20, 2016.

(51) Int. Cl.

| | |
|---|---|
| *H01L 29/778* | (2006.01) |
| *H01L 29/205* | (2006.01) |
| *H01L 29/423* | (2006.01) |
| *H01L 29/10* | (2006.01) |
| *H01L 29/06* | (2006.01) |
| *H01L 29/20* | (2006.01) |
| *H01L 21/8252* | (2006.01) |
| *H01L 29/66* | (2006.01) |
| *H01L 29/201* | (2006.01) |

(52) U.S. Cl.
CPC ...... *H01L 29/7787* (2013.01); *H01L 21/8252* (2013.01); *H01L 29/0673* (2013.01); *H01L 29/1037* (2013.01); *H01L 29/2003* (2013.01); *H01L 29/205* (2013.01); *H01L 29/42368* (2013.01); *H01L 29/66462* (2013.01); *H01L 29/7786* (2013.01); *H01L 29/1066* (2013.01); *H01L 29/201* (2013.01); *H01L 29/42364* (2013.01); *H01L 2029/42388* (2013.01)

(58) Field of Classification Search
CPC ......... H01L 29/1045; H01L 29/42364–42368; H01L 29/66462; H01L 29/7786–7787
See application file for complete search history.

(56) References Cited

U.S. PATENT DOCUMENTS

| | | | |
|---|---|---|---|
| 6,404,022 B1 * | 6/2002 | Blair | H01L 29/0696 257/337 |
| 9,041,003 B2 | 5/2015 | Palacios | |
| 2009/0261423 A1 | 10/2009 | Sawada | |
| 2011/0204380 A1 | 8/2011 | Yoshioka et al. | |

(Continued)

OTHER PUBLICATIONS

International Search Report and Written Opinion for Application No. PCT/US2017/067517 dated Apr. 9, 2018.

(Continued)

*Primary Examiner* — Daniel P Shook
(74) *Attorney, Agent, or Firm* — Wolf, Greenfield & Sacks, P.C.

(57) ABSTRACT

A transistor includes a first gate-controlled region having a first threshold voltage and a second gate-controlled region in parallel with the first gate-controlled region. The second gate-controlled region has a second threshold voltage different form the first threshold voltage.

24 Claims, 24 Drawing Sheets

(56) References Cited

U.S. PATENT DOCUMENTS

2016/0181364 A1* 6/2016 Stewart ............ H01L 29/42316
257/192

OTHER PUBLICATIONS

Alsharef et al., Theoretical Investigation of Trigate AlGaN/GaN HEMTs. IEEE Trans. on Electron Devices. Oct. 2013;60(10):3335-41.

Choi et al., A 5.9-GHz Fully Integrated GaN Frontemd Design with Physics-Based RF Compact Model. IEEE Transactions on Microwave Theory and Techniques. Apr. 2015;63(4):1163-73.

Mishra et al., GaN-Based RF Power Devices and Amplifiers. Proceedings of IEEE. Mar. 2008;(3):287-305.

Sun et al., Vertical GaN power FET on bulk GaN substrate. $74^{th}$ Annual Device Research Conference. 2016;1-2.

Vereecken et al., Power consumption in telecommunication networks: overview and reduction strategies. IEEE Communications Magazine. 2011;49.6:62-9.

\* cited by examiner

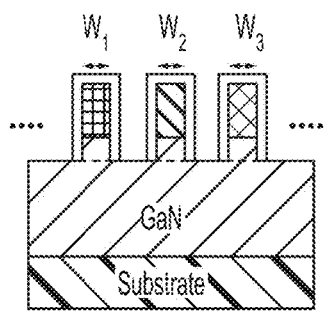
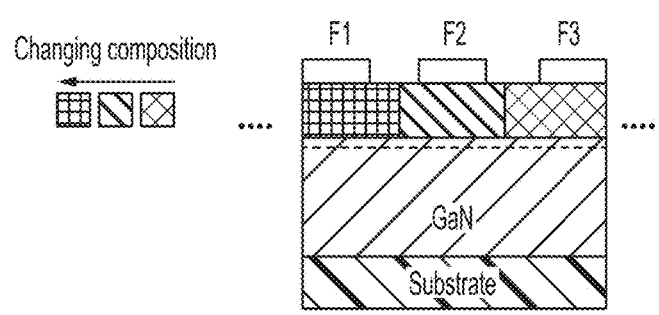
FIG. 9A　　　　　　　　　　　　　　FIG. 9B
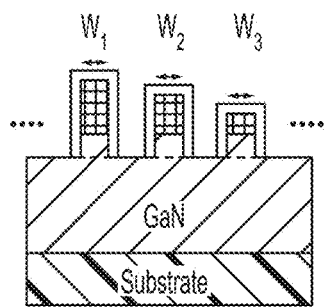
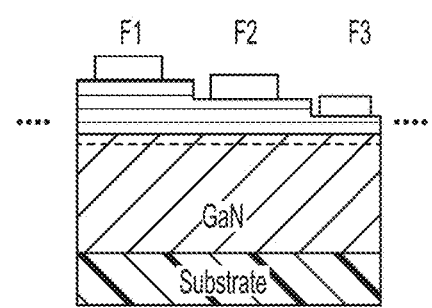
FIG. 10A　　　　　　　　　　　　　　FIG. 10B

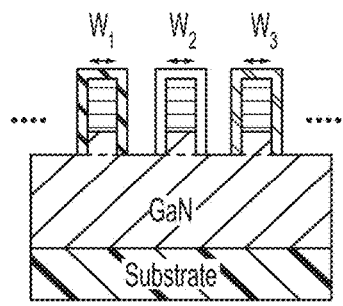
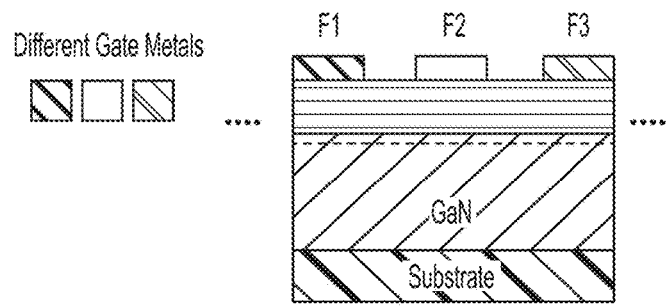
FIG. 11A
FIG. 11B
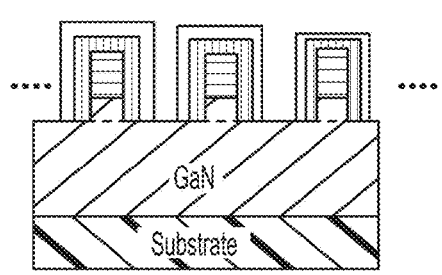
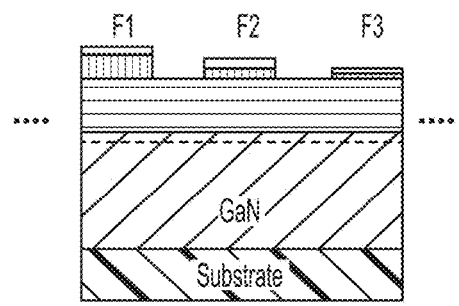
FIG. 12A
FIG. 12B
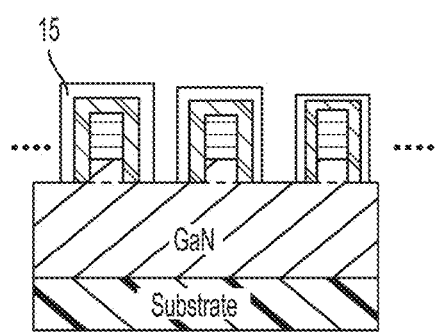
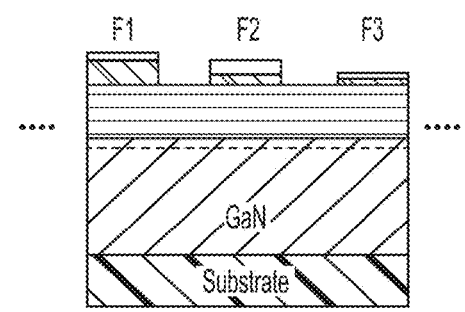
FIG. 13A
FIG. 13B FIG. 15A
FIG. 15C
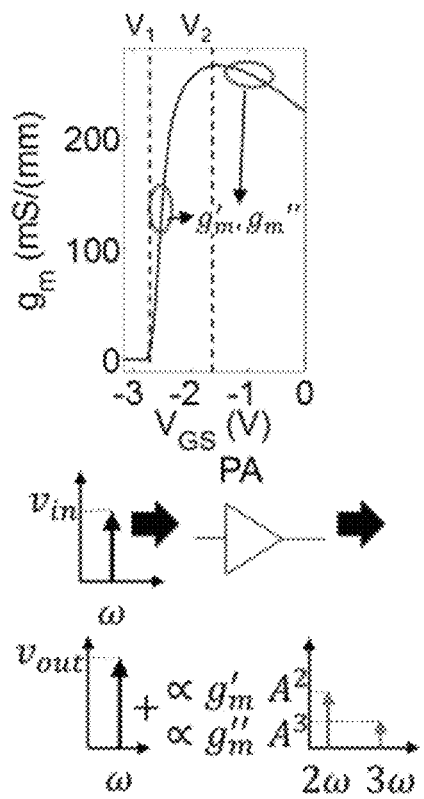
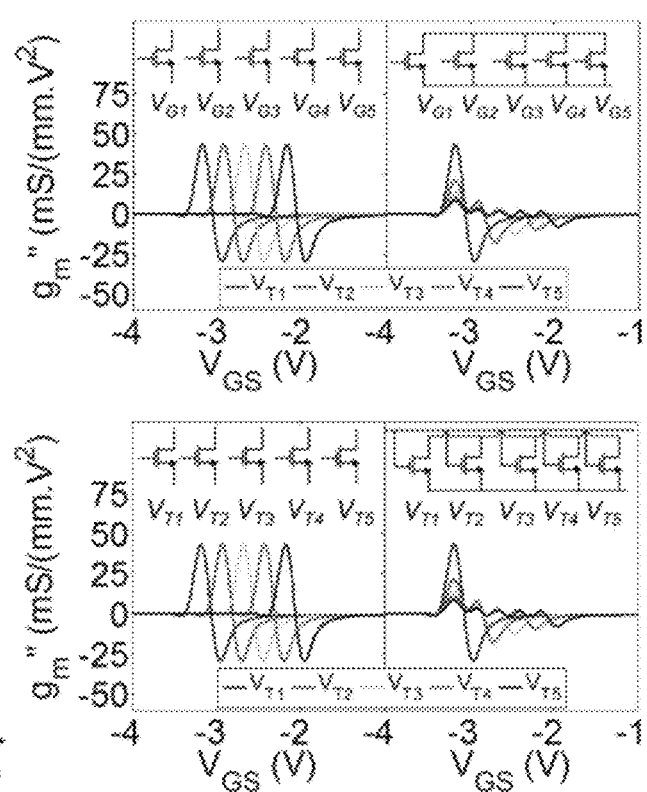
FIG. 15B
FIG. 15D FIG. 17A
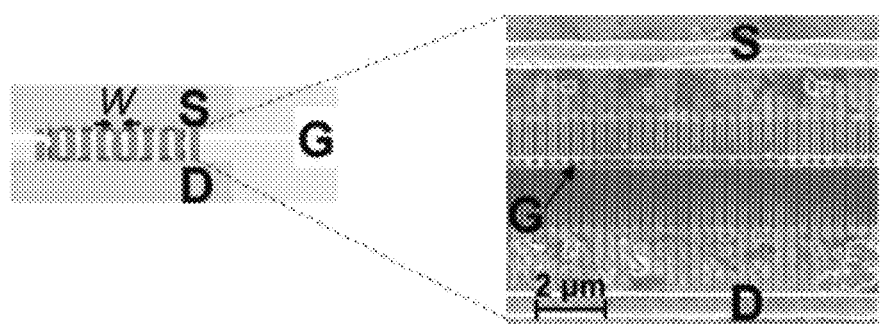
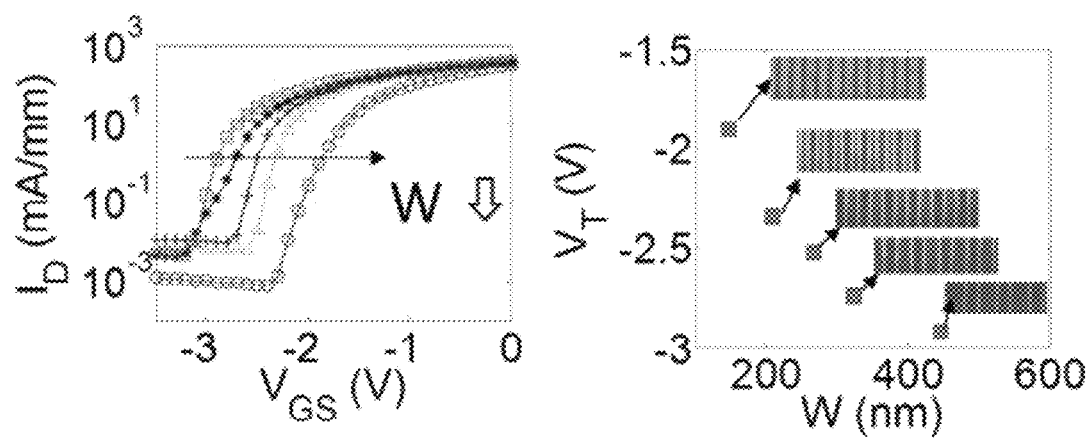
FIG. 17B
FIG. 17C

HIGH-LINEARITY TRANSISTORS

CROSS-REFERENCE TO RELATED APPLICATIONS

This application claims priority to U.S. provisional application Ser. No. 62/436,511, titled "THRESHOLD VOLTAGE-ENGINEERED NITRIDE-BASED HIGH PERFORMANCE TRANSISTORS FOR HIGH FREQUENCY AND/OR HIGH-POWER ELECTRONICS," filed Dec. 20, 2016, which is hereby incorporated by reference in its entirety.

BACKGROUND

1. Field of Invention

The techniques described herein relate to semiconductor devices, circuits and fabrication techniques that can improve linearity.

2. Discussion of the Related Art

Power amplifiers are used in a variety of technologies, such as wireless data communication, for example.

SUMMARY

Some embodiments relate to a transistor that includes a first gate-controlled region having a first threshold voltage and a second gate-controlled region in parallel with the first gate-controlled region. The second gate-controlled region has a second threshold voltage different form the first threshold voltage.

The transistor may be a field effect transistor.

The field effect transistor may be a high electron mobility transistor (HEMT).

The transistor may include a III-V semiconductor material.

The transistor may include a source, a drain and at least one gate.

The first and second gate-controlled regions may be controlled by the at least one gate and are in parallel between the source and the drain.

The first gate-controlled region and the second gate-controlled region may have different dimensions.

The first gate-controlled region and the second gate-controlled region have different widths.

The first gate-controlled region and the second gate-controlled region may have different compositions.

The first gate-controlled region may have a first barrier region and the second gate-controlled region has a second barrier region, and the first and second barrier regions may have different thicknesses.

The first gate-controlled region may be controlled by a first gate region having a first gate material and the second gate-controlled region may be controlled by a second gate region having a second gate material different from the first gate material.

The transistor may include a first gate dielectric overlying the first gate-controlled region and a second gate dielectric overlying the second gate-controlled region.

The first and second gate dielectrics may have different thicknesses and/or compositions.

The first gate-controlled region may be controlled by a first gate region and the second gate-controlled region may be controlled by a second gate region, the transistor may further include a first material overlying the first gate region and a second material overlying the second gate region, and the first and second materials may have different compositions, doping concentrations and/or thicknesses.

The first gate-controlled region may be controlled by a first gate finger and the second gate-controlled region may be controlled by a second gate finger.

The transistor may include a plurality of source and drain regions.

The first and second threshold voltages may be offset from one another to reduce $g''_m$.

The transistor may further include a third gate-controlled region having a third threshold voltage different from the first threshold voltage and the second threshold voltage.

The first and second threshold voltages may be offset from one another by 0.1-2V and the second and third threshold voltages may be offset from one another by 0.1-2V.

Some embodiments relate to circuit including a first transistor having a first threshold voltage and a second transistor in parallel with the first transistor. The second transistor has a second threshold voltage different from the first threshold voltage.

Some embodiments relate to a method of forming a transistor, including forming a first gate-controlled region having a first threshold voltage, and forming a second gate-controlled region in parallel with the first gate-controlled region. The second gate-controlled region has a second threshold voltage different from the first threshold voltage.

Some embodiments relate to a transistor including a plurality of gate-controlled regions in parallel with one another and having different threshold voltages.

The different threshold voltages may be offset from one another to reduce $g''_m$ for the transistor.

The plurality of gate controlled regions may include a first plurality of gate-controlled regions having a first threshold voltage and a second plurality of gate-controlled regions having a second threshold voltage, where a number of the first plurality of gate-controlled regions is different from a number of the second plurality of gate-controlled regions.

A number of the plurality of gate-controlled regions may be greater than five or greater than ten, and less than one thousand or less than one hundred.

A transistor, comprising:
a first sub-transistor having a first threshold voltage; and
a second sub-transistor in parallel with the first sub-transistor, the second sub-transistor having a second threshold voltage different form the first threshold voltage.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIGS. 9A and 9B illustrate varying threshold voltage by varying semiconductor composition.

FIGS. 10A and 10B illustrate varying threshold voltage by varying barrier region thickness.

FIGS. 11A and 11B illustrate varying threshold voltage by varying gate material composition.

FIGS. 12A and 12B illustrate varying threshold voltage by varying gate dielectric thickness and/or composition.

FIGS. 13A and 13B illustrate varying threshold voltage by varying the thickness and/or doping of a semiconductor region overlying the gate.

FIGS. 15A-D illustrate linearity for individual devices and a composite device.

FIG. 17A-C illustrates a type-I S-fin device and its characteristics.

DETAILED DESCRIPTION

Figure 1A:
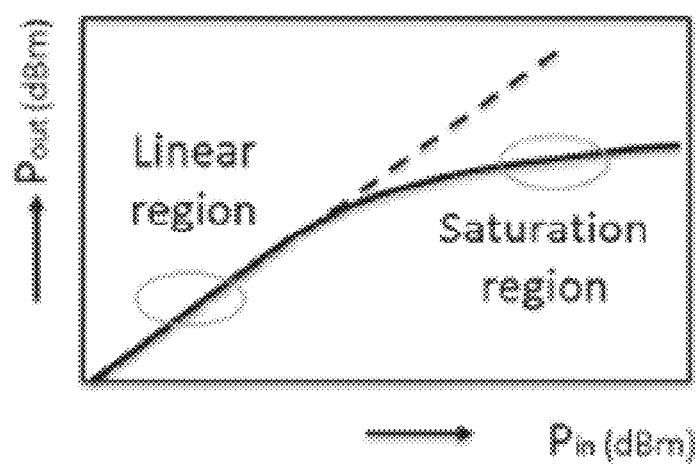
FIG. 1A shows a plot of output power vs. input power.
Figure 1B:
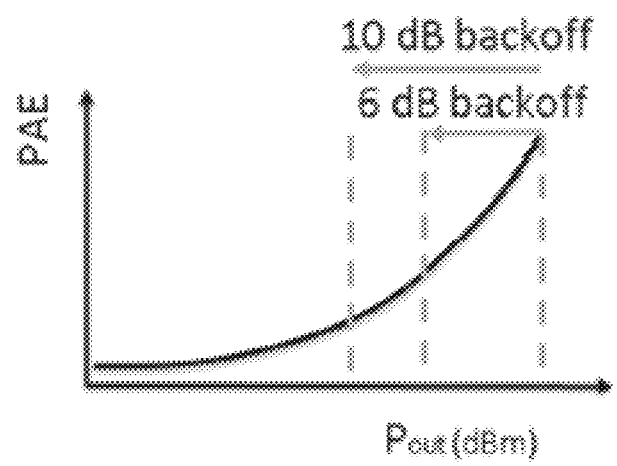
FIG. 1B shows a plot of PAE vs. output power.

The recent proliferation of mobile devices along with the surge in the demand for internet of things (IoT) is promoting the need for efficient wireless data communication. Key emergent applications ranging from 5G-LTE, WIMAX, SatCom, CAT-TV, radar, space applications, D2D and other communication protocols in the range of L-band to millimeter-wave may need to operate within stringent constraints on the spectral bandwidth as well as adjacent-channel interference. There is also a demand for lowering power consumption associated with standard communication protocols. The RF power amplifier (PA) in the base station of a cellular network consumes significant power. This indicates the importance of improving the power-added-efficiency (PAE: an efficiency metric for DC to RF power conversion) of the constituent solid-state transistors in the PA, while avoiding signal distortion and the degradation of signal quality. Modern digital modulation techniques may demand high linearity from RF-PAs in order to avoid intermodulation distortion and channel interference. Unfortunately, RF-PAs perform best in terms of PAE when they are driven near their saturation power-levels where they also exhibit the highest non-linearity. The non-linear behavior of the PA results from, among other issues, its constituent transistors exhibiting a non-linear relationship between their input (gate to source voltage: $V_{GS}$) and output (drain current: $I_D$) in the form of non-linear transconductance gain ($G_t$). This inherent trade-off between PAE and linearity is highlighted in FIG. 1A and FIG. 1B, along with an illustration of the back-off technique in FIG. 1B (operation of PAs 6-10 dB below the saturation power Psat). The non-linearity of the FET causes the $P_{out}$ to saturate as $P_{in}$ increases and creates non-linear output-signal along with signal distortion and adjacent channel interference. Any back-off in $P_{out}$ to maintain linearity will reduce PAE and increases power consumption of RF-PA.

Historically, silicon-based LDMOS transistors have been the primary devices used in the design of PAs, but have suffered from high losses, low operating frequency, low RF-power conversion capability and poor high-temperature performance. Opportunities for higher frequency power amplification have emerged with the development of Gallium Nitride (GaN) devices, which give a better electron mobility along with a higher critical electric field than those of silicon.

Figure 2A:
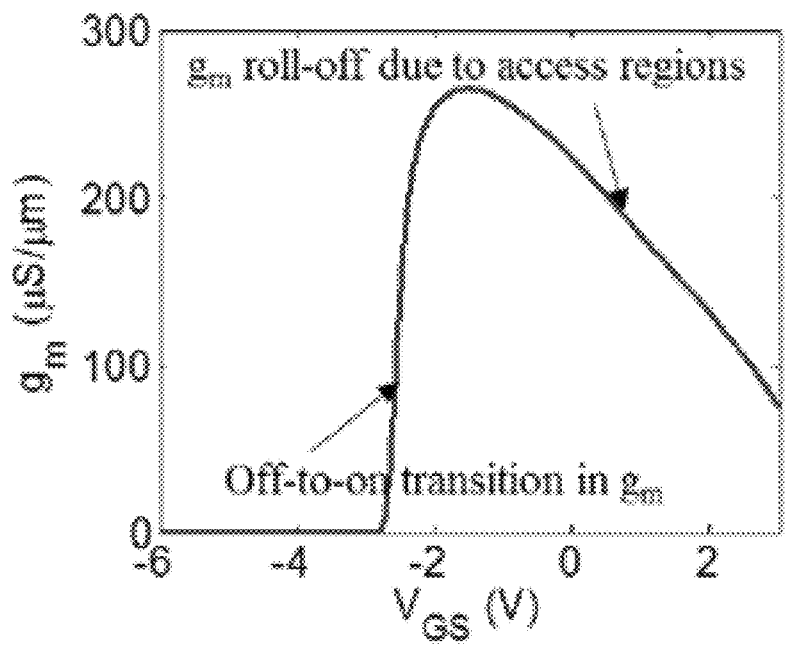
FIG. 2A shows the non-linear gain performance of a GaN HEMT in terms of its $g_m$.
Figure 2B:
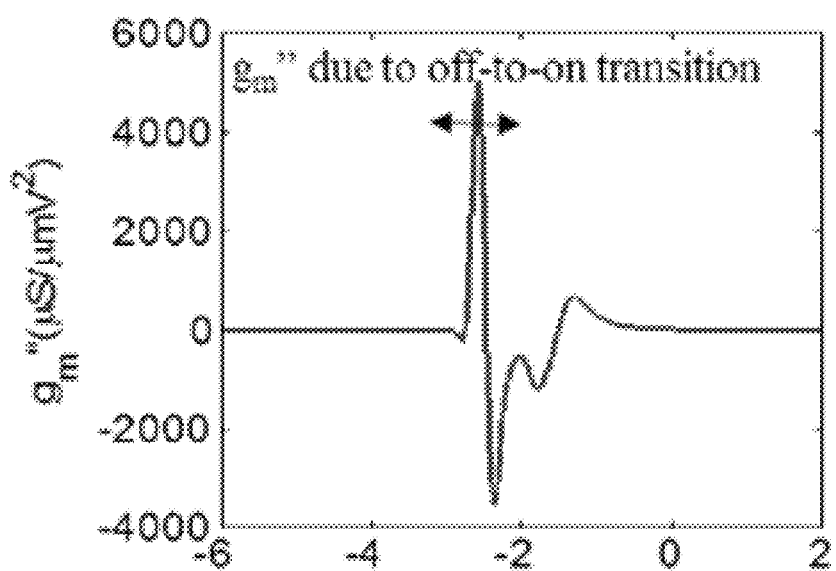
FIG. 2B shows the non-linear gain performance of a GaN HEMT in terms of its $g_m$ double derivative ($g_m''$) over the full operating regime of the PA.

The predominant GaN device architecture today is the planar High Electron Mobility Transistor (HEMT). These have two key limitations: (i) poor linearity performance in Class-B to -AB quiescent operating conditions ($V_{GS}$ around the threshold voltage ($V_T$)) due to the non-linear DC-transconductance ($g_m$) behavior around $V_T$, and (ii) transconductance roll-off at high quiescent operating conditions (Class-A) caused by the access regions of the device. FIG. 2A shows the non-linear gain performance of a GaN HEMT in terms of its $g_m$. FIG. 2B shows the non-linear gain performance of a GaN HEMT in terms of its $g_m$ double derivative ($g_m''$) over the full operating regime of the PA. Significant non-zero $g''_m$ content and hence intermodulation distortion (IMD) is present around $V_T$ due to the sharp transition form off-to-on state of the transistor, along with non-zero $g''_m$ at high $V_{GS}$ resulting from the access regions of the device.

Disclosed herein is a $V_T$-engineered transistor, circuits, and associated techniques that can address the limitations of prior transistor technologies, such as GaN transistors. In some embodiments, the $V_T$-engineered transistor has different $V_T$'s in different regions of the device. $V_T$ may be varied in discrete regions of the device or continuously across the device. This produces a transistor having a plurality of sub-transistors in parallel with different threshold voltages. The term "sub-transistors" refers to transistors having different gate-controlled regions that are constituent elements of a composite transistor. The drains of the sub-transistors may be connected together (at the same node or potential), the sources of the sub-transistors may be connected together (at the same node or potential) and the gates of the sub-transistors may be connected together (at the same node or potential). A gate-controlled region is a region (e.g., a channel) of a semiconductor device having its conductivity controlled by the gate. A gate-controlled region may include one or more semiconductor materials or regions of semiconductor materials. There can be a finite number of sub-transistors in the case of discrete regions or an infinite number in the case of a continuously varying threshold voltages across the device. In some embodiments, the variations in $V_T$ coincide with different carrier densities produced in different regions of the transistor.

Figure 3A:
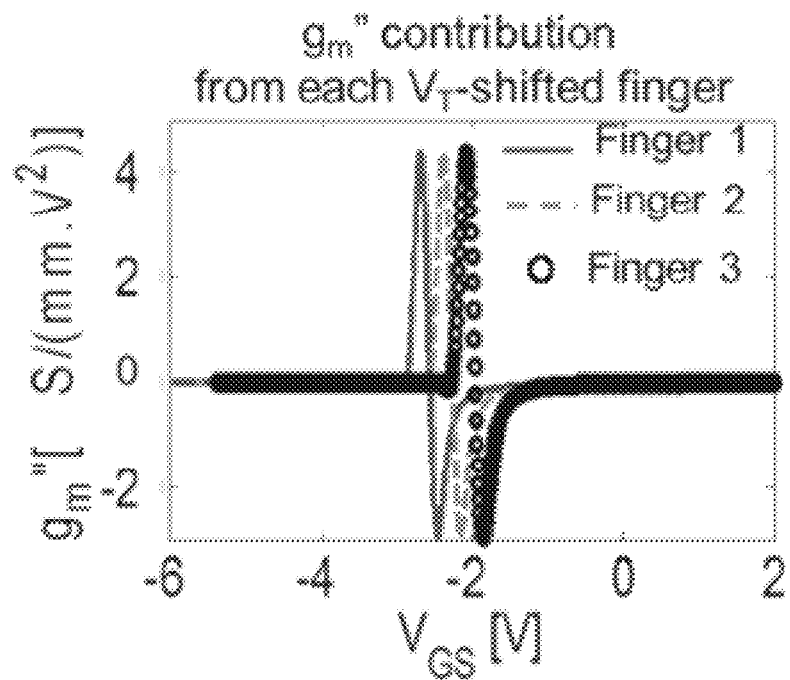
FIG. 3A shows the $g''_m$ characteristics of the constituent elements of an exemplary design.
Figure 3B:
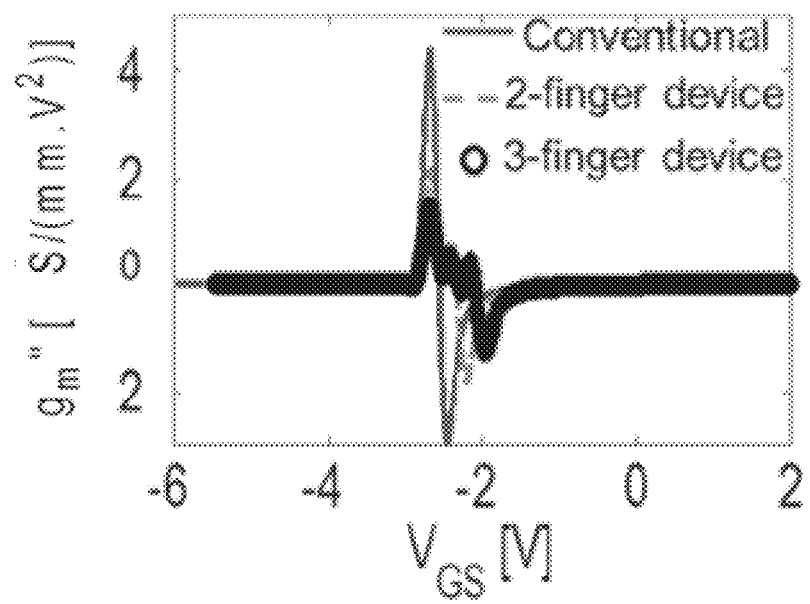
FIG. 3B shows the effective $g''_m$ behavior.

Several ways of producing different $V_T$s and different carrier densities are disclosed herein. For example, in a lateral GaN transistor, the $V_T$ can be changed along its width-direction either in a single gate finger or among multiple fingers. The techniques described herein can create multiple sub-transistors within a single device which are in parallel (either in multiple fingers and/or along the width-direction in the same finger, in the case of a lateral GaN transistor) and have $V_T$ offsets between them. The $g''_m$ characteristics of the constituent elements of an exemplary design are shown in FIG. 3A and the effective $g''_m$ behavior of the composite device is shown in FIG. 3B. In some embodiments, the offset in $V_T$ between different gate-controlled regions or sub-transistors may be between 0.1 and 2.0 V.

As can be seen, the $V_T$ offsets among the parallel elements are such that the non-zero components of $g''_m$ are at least partially cancelled to yield an overall lower $g''_m$ in the composite device. This can be done by aligning the peak(s) of $g''_m$ from one or more regions with the valley(s) of $g''_m$ from another region in parallel to reduce the magnitudes of the peaks and/or valleys of $g''_m$. This technique to lower the $g''_m$ (as well as the gate capacitance derivatives) translates to large signal linearity improvements in the composite device. By using this new technology, GaN transistors can potentially overcome the non-linearity limitations of conventional GaN transistors. This may allow them to exceed the functional parity with Si-RF devices to gain widespread adoption, which will improve the system level power efficiency in communication systems while retaining signal integrity.

In this disclosure, we describe new $V_T$-engineered structures based on III-Nitride semiconductors. Using these new transistor structures and fabrication technologies, high performance III-Nitride based RF or high power-transistors can be fabricated. Similar technology can be applied to improve the linearity of transistors made with materials other than III-Nitride semiconductors. However, the techniques described herein may be applied to other III-V semiconductor materials or other types of semiconductor materials.

Figure 3C:
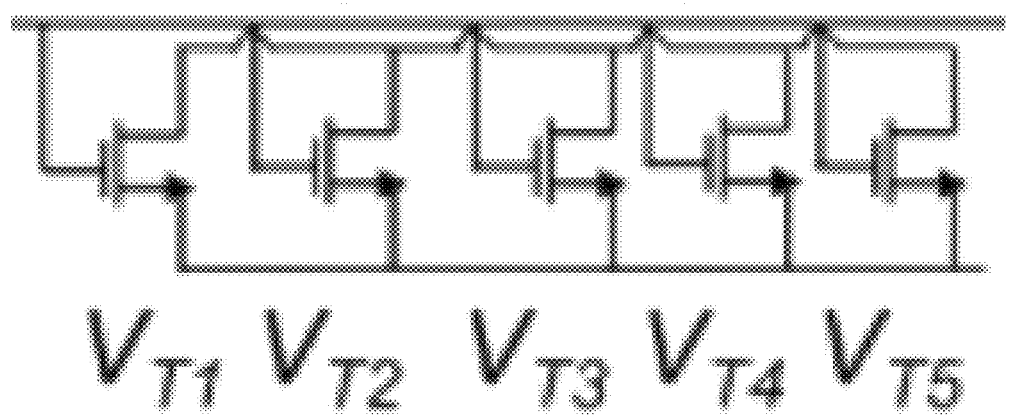
FIG. 3C illustrates an example in which a plurality of transistors with different $V_T$s are connected in parallel with their sources connected together, their drains connected together, and their gates connected together.

The threshold voltage can be varied across a transistor to achieve effectively a plurality of sub-transistors in parallel with different threshold voltages. Alternatively, separate transistors with different threshold voltages may be connected in parallel. The transistors or sub-transistors with different threshold voltages may be formed on the same substrate or different substrates. FIG. 3C illustrates an example in which a plurality of transistors with different $V_T$s are connected in parallel with their sources connected together, their drains connected together, and their gates connected together.

Prior to discussing ways in which $V_T$ can be engineered, exemplary transistor structures will be described.

Exemplary Transistor Structures

Figure 4A:
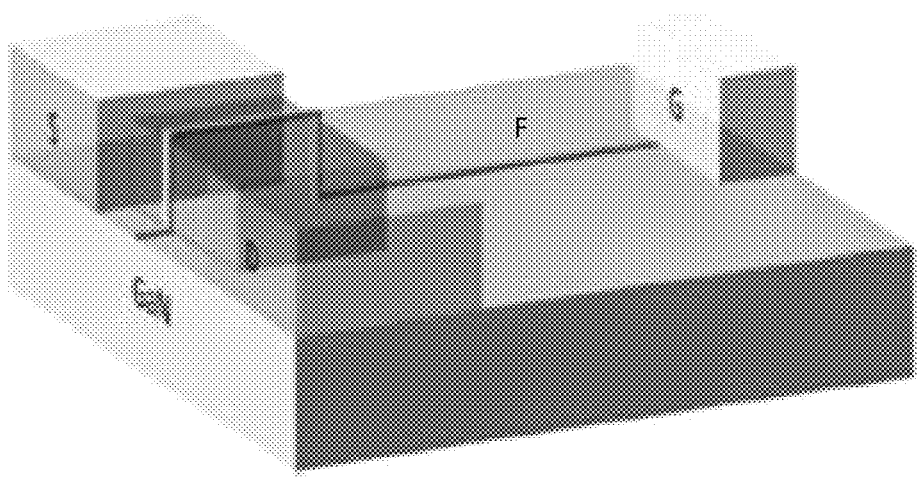
FIGS. 4A and 4B illustrate a conventional planar HEMT.
Figure 4B:
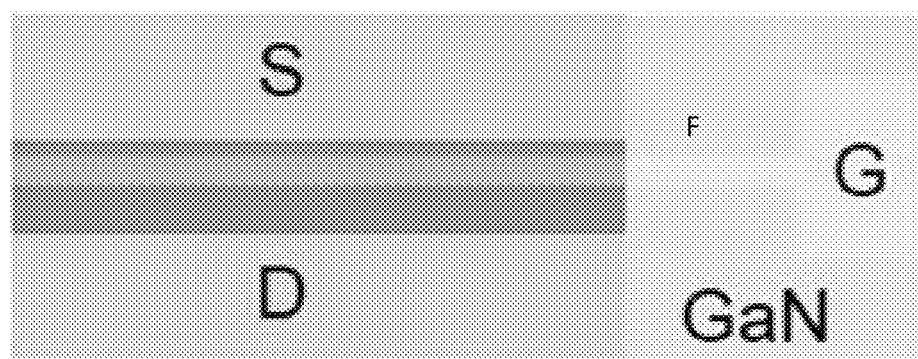
Figure 4C:
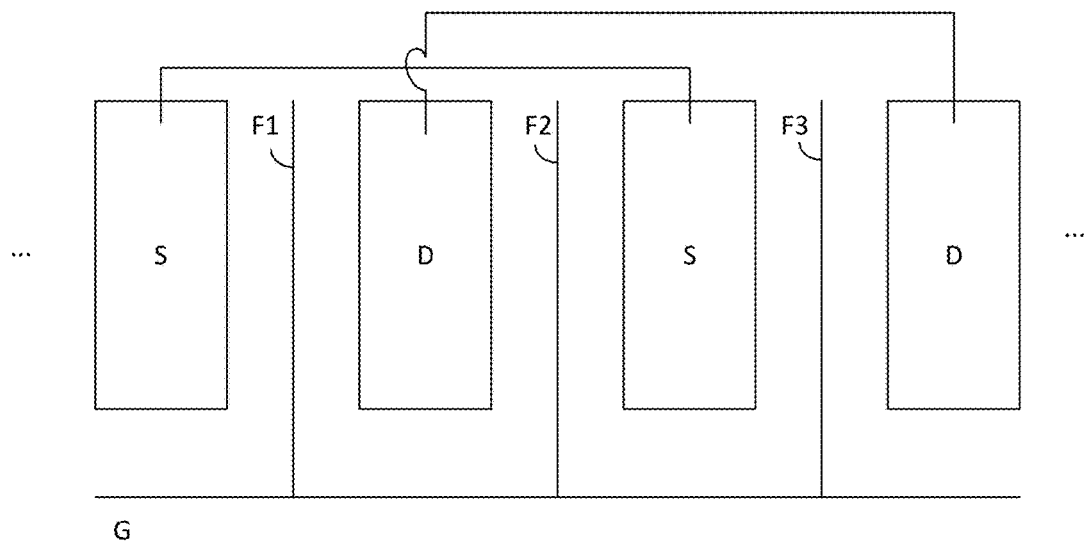
FIG. 4C shows another example of a conventional planar HEMT with a plurality of gate fingers.

FIGS. 4A and 4B illustrate a conventional planar HEMT. As illustrated, a single gate finger F extends over the semiconductor region between the source S and the drain D. A single channel extends between the source and the drain. FIG. 4C shows another example of a planar HEMT that can produce more current than with a single gate finger. As shown in FIG. 4C, the transistor includes a plurality of alternating source and drain regions. The transistor includes a plurality of gate fingers F1-F3, each between a respective source and drain region. The source regions are connected together and the drain regions are connected together. The transistor of FIG. 4C effectively has a plurality of sub-transistors connected in parallel.

FIGS. 5A-5E and 6A-6H illustrate a transistor structure having a nanowire configuration or a fin configuration.

Figure 5A:
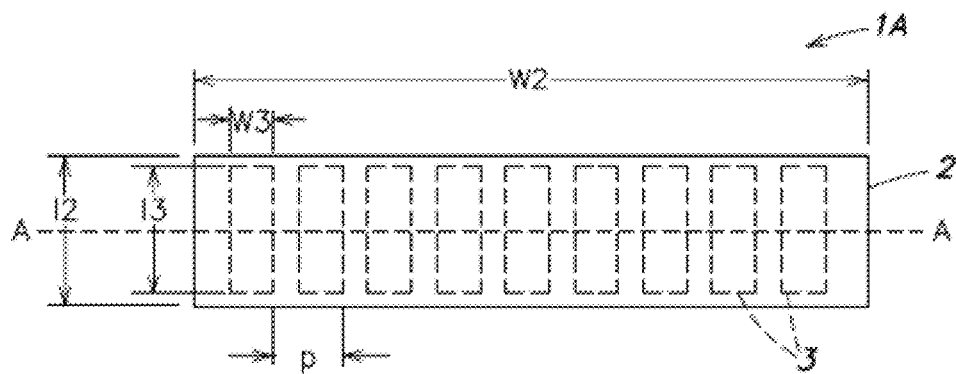
FIGS. 5A-5E and 6A-6H illustrate a transistor structure having a nanowire (or castellated) configuration or a fin configuration.

FIG. 5A shows a top view of an electrode structure 1a which may be formed in a semiconductor chip, according to some embodiments. As shown in FIG. 5A, electrode structure 1A includes an upper electrode region 2 and lower electrode regions 3 extending downward from the upper electrode region 2. As shown in FIG. 5A, the lower electrode regions 3 may include conductive plates or other regions extending parallel to one another. The lower electrode regions 3 may have a patterned structure. As shown in the example of FIG. 5A, the lower electrode regions 3 may have a periodic structure of a period p. The lower electrode regions 3 may have a length 13 and a width w3, as shown in FIG. 5A. The upper electrode region 2 may have a length 12 and a width w2.

Figure 5B:
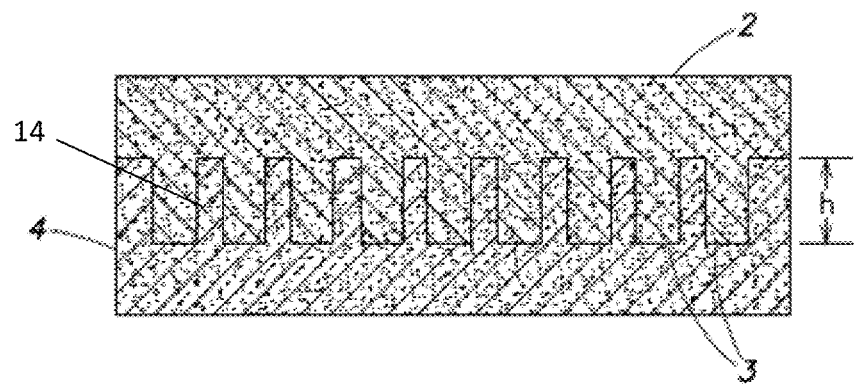

FIG. 5B shows a cross section of the electrode structure of FIG. 5A along the line A-A of FIG. 5A. As shown in FIG. 5B, the upper electrode region 2 may be formed over a semiconductor region 4. The lower electrode regions 3 are recessed within the semiconductor region 4, as lower electrode regions 3 extend downward from the upper electrode region 2 into the semiconductor region 4. In the example shown in FIG. 5B, the lower electrode regions 3 are formed in trenches in the semiconductor region 4. The lower electrode regions 3 may fill all or a portion of the trenches. The trenches have a height h. The semiconductor region(s) between the trenches are referred to herein as fins 14.

Figure 5C:
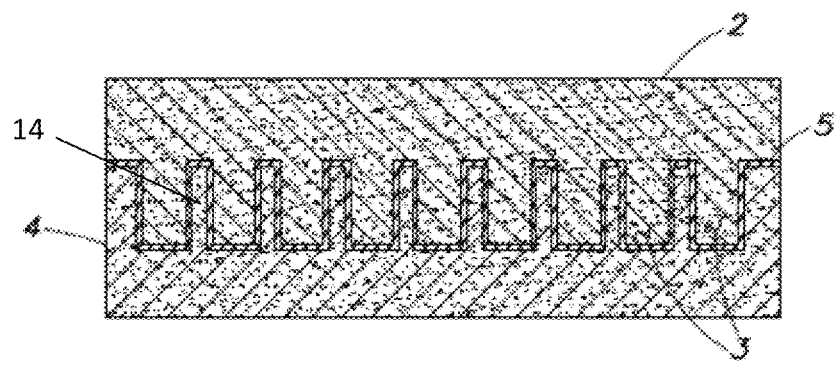

FIG. 5C shows the cross section of another embodiment of an electrode structure in which an insulating material 5 is present between the semiconductor region 4 and the electrode structure 1A. In such an embodiment, insulating material 5 may be present along the entire interface between the semiconductor region 4 and the electrode structure 1A or a portion of the interface between the semiconductor region 4 and the electrode structure.

Figure 5D:
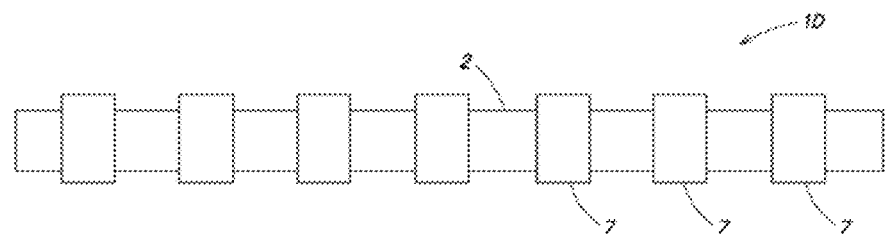

FIG. 5D shows the top view of another variation of an embodiment of an electrode structure 1D in which the trenches 7 extend beyond the area of the chip covered by the upper electrode region 2 on both a first side and a second side of the upper electrode region 2. Lower electrode regions 3 may extend into the trenches 7. Lower electrode regions 3 may fill all or a portion of the trenches 7. For example, if lower electrode regions 3 fill a portion of the trenches 7, the lower electrode regions may fill the portion of trenches 7 lying below the upper electrode region 2. Electrode structure 1D may have a cross section as illustrated in FIG. 5B or FIG. 5C, for example.

Figure 5E:
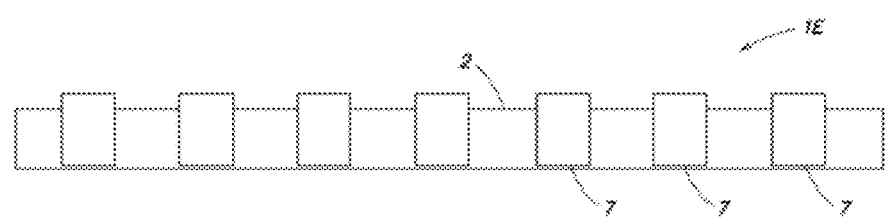

FIG. 5E shows the top view of another variation of an embodiment of an electrode structure 1E in which the trenches 7 extend beyond the area of the chip covered by the upper electrode region 2 on one side of the upper electrode region 2. Lower electrode regions 3 may extend into the trenches 7. Lower electrode regions 3 may fill all or a portion of the trenches 7. For example, if lower electrode regions 3 fill a portion of the trenches 7, the lower electrode regions may fill the portion of trenches 7 lying below the upper electrode region 2. Electrode structure 1E may have a cross section as illustrated in FIG. 5B or FIG. 5C, for example.

Any suitable electrode structure may be used. In some embodiments, an electrode structure 1 may be used having a top view as illustrated in FIG. 5A, 5D, or 5E. The electrode structure may have any suitable cross section, such as those shown in FIGS. 5B and 5C. The reference to "electrode structure 1" herein is used to refer to an electrode structure as illustrated in any of FIGS. 5A, 5D, and 5E having any suitable cross section, such as those illustrated in FIGS. 5B and 5C.

A variety of suitable materials may be used for the electrode structure 1, semiconductor region 4, and insulating material 5. In some embodiments, semiconductor region 4 includes one or more layers of III-V semiconductor material, such as a III-N semiconductor material including a group III element and nitrogen. Examples of suitable group III-N materials include GaN (Gallium Nitride), $Al_{x1}Ga_{1-x1}N$ (Aluminum Gallium Nitride with any suitable Aluminum content x1) and $Al_{x2}In_{y2}Ga_{z2}N$ (Aluminum Iridium Gallium Nitride with any suitable Aluminum, Iridium and Gallium contents x2, y2 and z2, respectively, where x2+y2+z2=1 and each of x2, y2 and z2 is greater than or equal to 0 and less than or equal to 1), by way of example. However, any suitable types of semiconductor materials may be used. In some embodiments, semiconductor region 4 may include a group IV semiconductor such as Si (Silicon) and/or Ge (Germanium) and/or SiC (Silicon Carbide) and/or diamond. However, any suitable type of semiconductor material may be used, not limited to III-V or group IV semiconductors. Electrode structure 1 may be formed of a metal, a metal alloy, or any other suitable conductive material, such as a doped semiconductor material, for example. Upper electrode region 2 and lower electrode regions 3 may be formed of the same material or a different material. In some embodiments, a wide bandgap material (e.g., aluminum nitride) may be used. If an insulating material 5 is present, any suitable type of insulating material may be used for insulating material 5 such as an oxide (e.g., silicon oxide), a nitride (e.g., silicon nitride), etc.

Electrode structures such as those shown in FIGS. 5A-5E may be included in semiconductor devices such as transistors for example. In some embodiments, a field effect transistor (FET) may include an electrode structure as described herein for one or more of the following electrodes: the gate electrode, the source electrode, or the drain electrode. In some embodiments, a field effect transistor may be formed in which an electrode structure as described herein is included as a field plate or an anode of a body diode.

The use of an electrode structure having an electrode region recessed within a semiconductor region can enable reducing the leakage current for field effect transistors. In conventional nitride-based transistors, when the transistor is in the off-state and blocking a voltage present at the drain, leakage current can flow between the source and drain regions beneath the channel region of the transistor due to the reduction of channel barrier height. This phenomenon is referred to as DIBL (Drain Induced Barrier Lowering). The effect of DIBL may be particularly large for transistors with smaller gate lengths. The present inventors have appreciated that conventional gate electrodes are ineffective to reduce the leakage current that flows below the channel region of the transistor. The electrode structures described herein can reduce leakage current flowing below the channel region through the use of electrode regions extending down into the semiconductor region, e.g., on the sides of the channel region. When such an electrode is used as the gate of the transistor or as a field plate, for example, portions of the electrode are closer to the region below the channel in which leakage current tends to flow, enabling increasing the potential barrier in this region and reducing the leakage current.

Figure 6A:
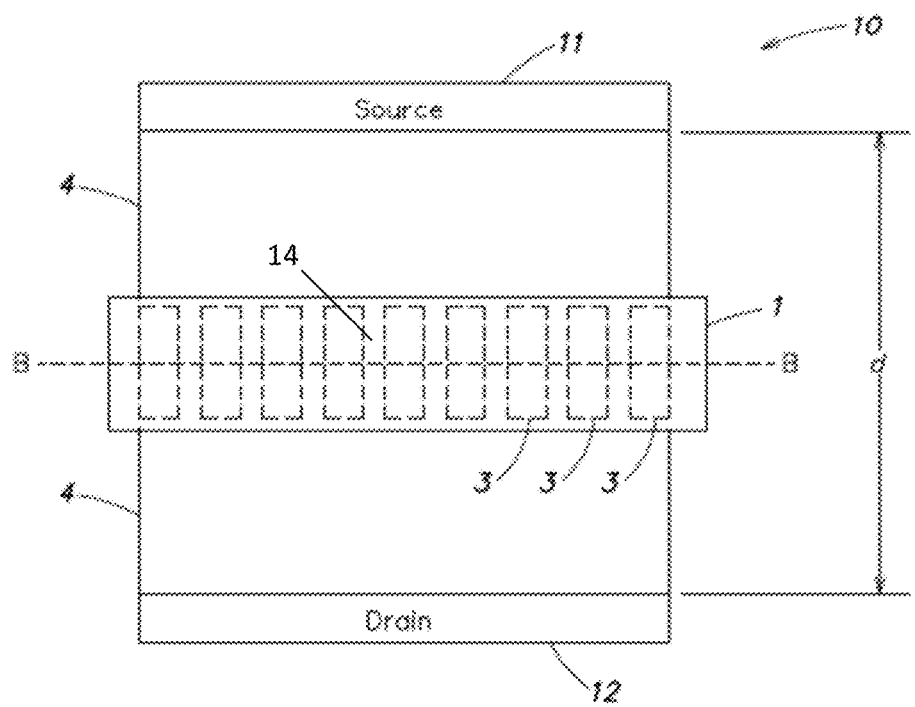

FIG. 6A shows an example of a field effect transistor 10 formed in a semiconductor region 4, according to some embodiments. In some embodiments, the field effect transistor 10 may be a HEMT (High Electron Mobility Transistor), MIS-HEMT (Metal-Insulator-Semiconductor-HEMT), MISFET (Metal-Insulator-Semiconductor Field Effect Transistor), JFET (Junction Field Effect Transistor) or MESFET (Metal-Semiconductor Field Effect Transistor). Field effect transistor 10 includes a source region 11 and a drain region 12. Between source region 11 and drain region 12 is formed an electrode structure 1. Although electrode structure 1 is shown as having a configuration as illustrated in FIG. 5A, electrode structure 1 may be formed in a different configuration, such as those shown in FIGS. 5D and 5E. As shown in FIG. 6A, the electrode structure 1 extends only a portion of the distance d between the source region 11 and the drain region 12. The semiconductor region 4 may include access regions such as drift and/or diffusion regions between the gate and the source 11 and/or drain 12. The fins 14 may extend across a portion of the distance between the source and the drain, as shown in FIG. 6A, or may extend the entire distance between the source and the drain. In some embodiments, electrode structure 1 may form the gate of the field effect transistor 10. As discussed above, trenches may be formed in the semiconductor region 4, and the lower electrode regions 3 of the electrode structure 1 may be formed in the trenches, such that the lower electrode regions 3 of the electrode structure 1 extend into the semiconductor region 4. As shown in FIG. 6A, the trenches in which the lower electrode regions 3 are formed extend along a direction that extends between the source region and the drain region. The direction in which the trenches extend may be parallel to a direction of current flow in channel regions of the field effect transistor 10.

Figure 6B:
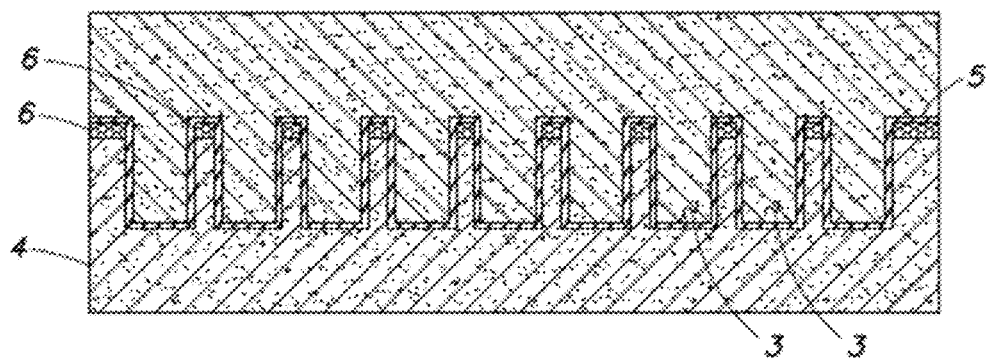

FIG. 6B shows a cross section of the field effect transistor 10 along the line B-B shown in FIG. 6A, according to some embodiments. FIG. 6B shows that a second semiconductor region 6 can be formed above semiconductor region 4. As shown in FIG. 6B, a second semiconductor region 6 may be formed between each upwardly-extending portion of semiconductor region 4 and the upper electrode region 2 of the electrode structure 1. A first semiconductor region 4 and the second semiconductor region 6 may be formed of different materials to form a heterostructure that establishes a channel at the interface of semiconductor regions 4 and 6 for establishing conduction using a two-dimensional electron gas (2DEG). Second semiconductor region 6 may be referred to as a "barrier region." The second semiconductor region 6 may include a semiconductor material having a bandgap larger than that of the first semiconductor region 4. In some embodiments, the second semiconductor region 6 may include several semiconductor layers to introduce a conduction (and/or valence) band discontinuity with semiconductor region 4.

Figure 6C:
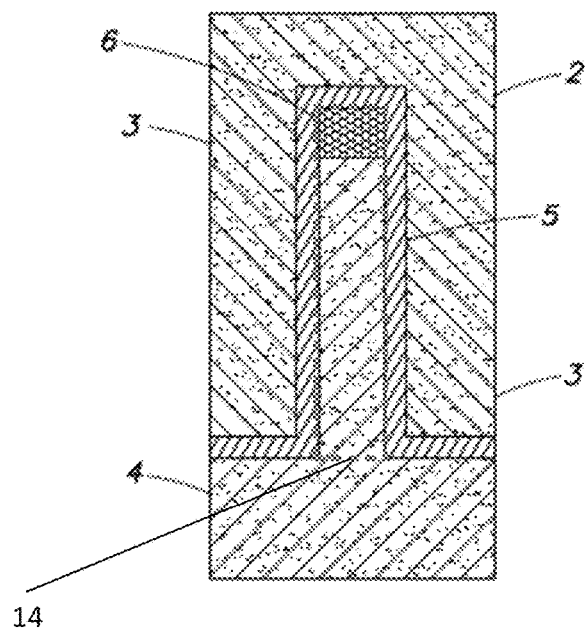

FIG. 6C shows a portion of FIG. 6B in greater detail, illustrating a region in which a channel is established between the first semiconductor region 4 and the second semiconductor region 6, such that current may flow between the source region 11 and the drain region 12. Regions 4 and 6 between respective trenches collectively form a fin 14. As shown in FIG. 6B, a plurality of such regions may be formed to establish a corresponding plurality of channels between the source and drain regions. In some embodiments, the trenches in the semiconductor region 4 may be patterned and formed parallel to one another. Between each of the trenches an upwardly-extending region of semiconductor region 4 exists in which a channel may be formed. Any suitable number of such channel regions may be formed.

In some embodiments, the first semiconductor region 4 and the second semiconductor region 6 may be formed of III-N semiconductor materials, as discussed above. For example, the first semiconductor region 4 may be formed of GaN (Gallium Nitride) and the second semiconductor region 6 may be formed of AlGaN (Aluminum Gallium Nitride). In some embodiments, the first semiconductor region 4 may include AlInGaN of a first composition ($Al_{x1}In_{y1}Ga_{z1}N$) and the second semiconductor region 6 may include AlInGaN of a second composition ($Al_{x2}In_{y2}Ga_{z2}N$). However, any suitable nitride or non-nitride semiconductor materials may be used. In some embodiments, semiconductor region 4 and/or 6 may include multiple layers of semiconductors. For example, in some embodiments the first semiconductor region 4 may include a GaN/InGaN/GaN structure and the second semiconductor region 6 may include an AlN/AlGaN structure.

Figure 6D:
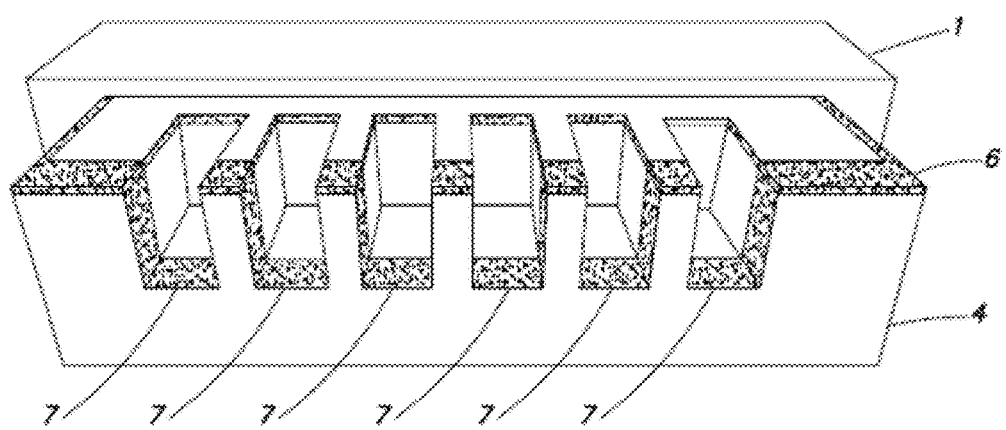
Figure 6E:
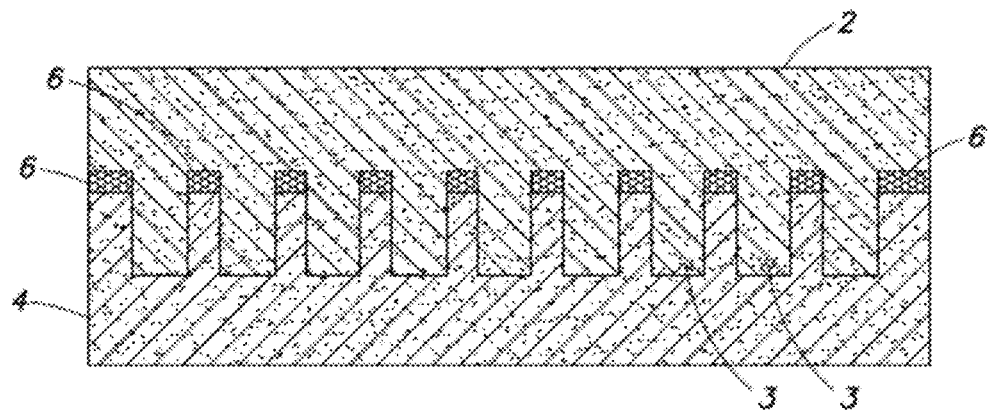
Figure 6F:
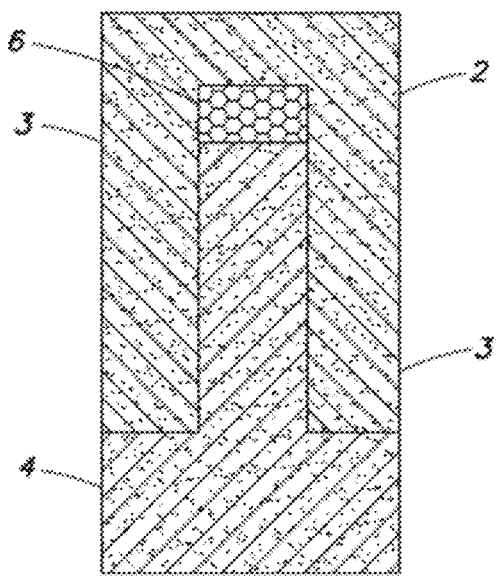

FIG. 6D illustrates a perspective view of the cross section shown in FIG. 6B. FIG. 6D illustrates that the lower regions 3 of electrode structure 1 are formed in trenches 7 in the semiconductor region 4. Though an insulating material 5 may be present between the electrode structure 1 and the semiconductor regions 4 and/or 6, insulating material 5 is not shown in FIG. 6D for clarity. Such an insulating material 5 may be desirable for reducing the gate leakage current. However, insulating material 5 is optional, as some embodiments do not include an insulating material 5 between the semiconductor region 4 and/or 6, and the electrode structure 1. FIG. 6E shows an embodiment in which insulating material 5 is not included. FIG. 6F shows a portion of FIG. 6E corresponding to a channel region in further detail. In some embodiments, an insulating material may be formed along only a portion of an interface between semiconductor regions 4 and/or 6 and electrode 1.

Figure 6G:
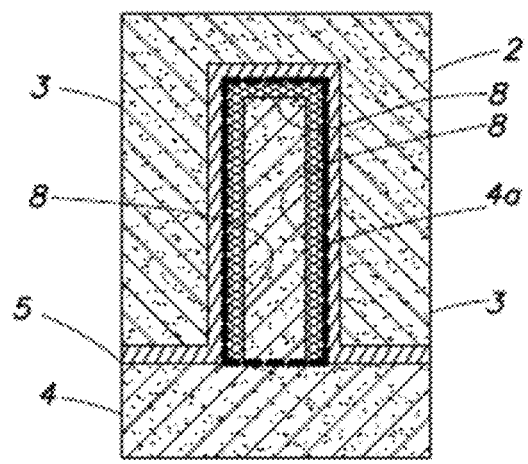

In some embodiments, a field effect transistor may be formed in which the cross section along the line B-B of FIG. 6A is as shown in FIG. 5B or 5C. That is, a field effect transistor may be formed without the second semiconductor region 6. Such a transistor may be a PMOS or NMOS transistor, for example, having source and drain regions of a first conductivity type (i.e., P-type or N-type) and an intermediate region of low or opposite conductivity type (i.e., N-type or P-type) in which a channel may be formed. Such a transistor can be controlled by changing the gate voltage to produce (or restrict) a channel region in which the conductivity of the intermediate region is inverted. When an electrode structure as illustrated in FIG. 5B or 5C is used, channel regions can be formed all along the interface between the electrode structure 1 and the semiconductor region 4. As shown in FIGS. 5B and 5C, upwardly-extending portions of the semiconductor region 4 extend toward the upper portion 2 of the electrode structure 1 between the lower regions 3 of the electrode structure 1. FIG. 6G illustrates that in each upwardly-extending region 4a of the semiconductor region 4, three channels 8 may be formed: a top channel and two channels extending along the sidewall of the upwardly-extending region 4a.

The field effect transistor 10 may be a normally-on (depletion mode) transistor or a normally-off (enhancement mode) transistor, for example. In a normally-off field effect transistor, a gate-source voltage of 0 V maintains the transistor in the off-state, and the transistor may sustain a blocking voltage across the source and drain terminals. To turn on the normally-off transistor, a positive gate-source voltage in excess of the threshold voltage of the transistor may be applied. In a normally-on field effect transistor, the transistor is on when a gate-source voltage of 0 V is present, allowing the transistor to conduct current through the channel region. To turn off the normally-on transistor, a negative gate-source voltage lower than the threshold voltage of the transistor may be applied.

Figure 6H:
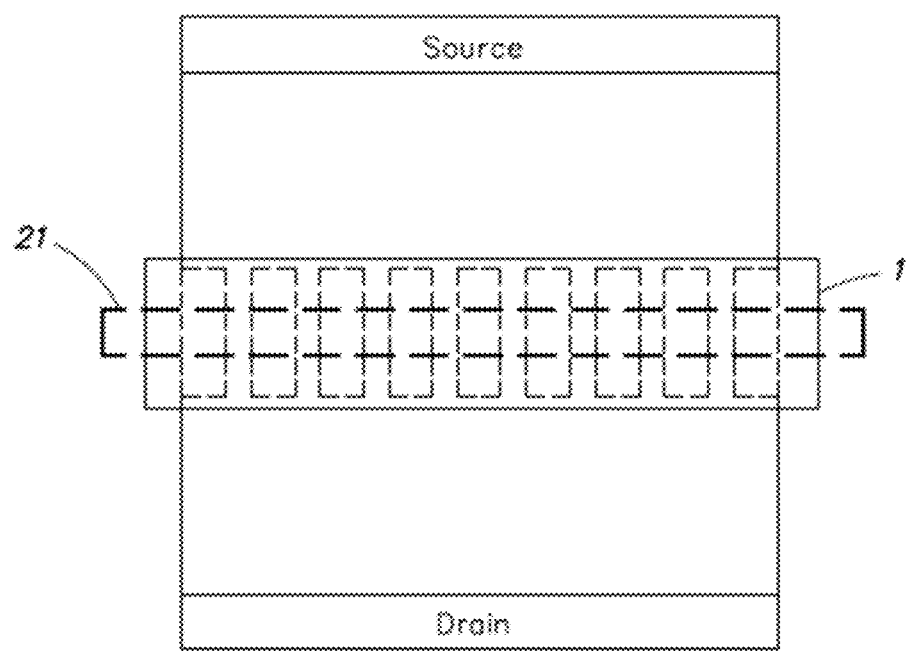

In some embodiments, high performance normally-off nitride transistors can be fabricated that include an electrode structure as described herein and a normally-off gate region 21, as schematically illustrated in FIG. 6H. The normally-off gate region 21 may be formed across the trenches and semiconductor region 6. A conductive electrode structure 1 may be formed on the normally-off gate region 21. A normally-off gate region 21 can be formed by any suitable method, such as removing (e.g., recessing) a portion of semiconductor region 6 and/or by modifying the upper surface of semiconductor region 6. Suitable techniques for forming a normally-off gate region 21 include, by way of example, 1) a gate recess technique as described in W. B. Lanford, T. Tanaka, Y. Otoki, and I. Adesida, "Recessed-gate enhancement-mode GaN HEMT with high threshold voltage," Electronics Letters, vol. 41, p. 449, 2005 and W. Saito, Y. Takada, M. Kuraguchi, K. Tsuda, and I. Omura, "Recessed-gate structure approach toward normally off high-Voltage AlGaN/GaN HEMT for power electronics applications," IEEE Transactions on Electron Devices, vol. 53, pp. 356-362, February 2006, 2) plasma treatment as described in Bin Lu, O. I. Saadat, E. L. Piner, and T. Palacios, "Enhancement-mode AlGaN/GaN HEMTs with high linearity fabricated by hydrogen plasma treatment," in Device Research Conference, 2009. DRC 2009, 2009, pp. 59-60 and Yong Cai, Yugang Zhou, K. J. Chen, and K. M. Lau, "High-performance enhancement-mode AlGaN/GaN HEMTs using fluoride-based plasma treatment," IEEE Electron Device Letters, vol. 26, pp. 435-437, July 2005, 3) GaN MISFETs as described in W. Huang, T. Chow, Y. Niiyama, T. Nomura, and S. Yoshida, "730V, 34 mΩ-cm2 lateral epilayer RESURF GaN MOSFET," in Power Semiconductor Devices & IC's, 2009. ISPSD 2009. 21st International Symposium on, pp. 29-32 and Ki-Sik Im et al., "Normally Off GaN MOSFET Based on AlGaN/GaN Heterostructure With Extremely High 2DEG Density Grown on Silicon Substrate," IEEE Electron Device Letters, vol. 31, pp. 192-194, March 2010, 4) a gate-injection technique as described in Y. Uemoto et al., "Gate Injection Transistor (GIT)—A Normally-Off AlGaN/GaN Power Transistor Using Conductivity Modulation," IEEE Transactions on Electron Devices, vol. 54, pp. 3393-3399, 2007, 5) polarization engineering, by way of example, or any other suitable method. In some embodiments, the normally-off gate region may have a sub-micron gate length to reduce device on-resistance. The electrode structure 1 can reduce the buffer leakage and the short channel effect of the normally-off gate region 21. The gate electrode 1 may also increase the current density and reduce on-resistance by inducing sidewall channels and/or introducing mechanical deformation in semiconductor region 4 and 6 in a case where semiconductor regions 4 and 6 are formed of piezoelectric material.

Varying $V_T$ and/or Carrier Density

There are multiple ways to engineer the $V_T$ in a transistor to improve its linearity based on the techniques described herein. Each of these techniques can be applied to each gate finger in the device independently, or to groups of gate fingers. The sections below describe a few potential implementations, however there are many other options for realizing $V_T$ variations across the device (e.g. from gate finger to gate finger, or even within a given gate finger). These variations in the $V_T$, can then be engineered to reduce $g''_m$.

Channels with Different Dimensions

Figure 7A:
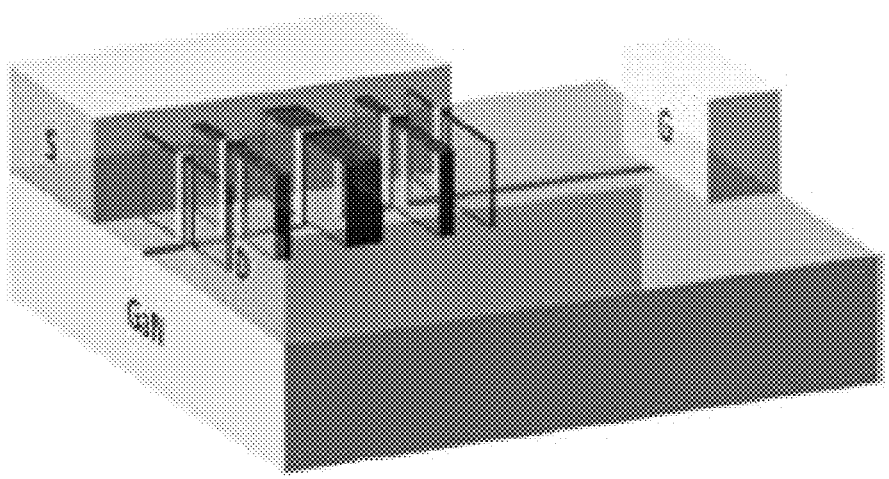
FIG. 7A shows a perspective view and FIG. 7B shows a top view of a transistor structure having a nanowire configuration or a fin configuration.
Figure 7B:
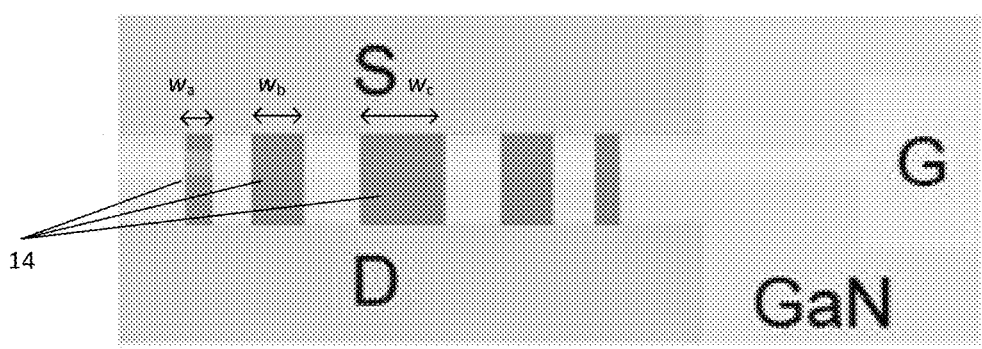

In some embodiments, the $V_T$ may be varied across a transistor as illustrated in FIGS. 5 and 6 by including a plurality of regions 14 with different dimensions to produce different threshold voltages in different regions of the transistor. Each region 14 may have its own channel. In some embodiments, the plurality of regions 14 may be a nanowire (NW) (or fin-) based structure. The transistor may include a plurality of regions 14 with different dimensions, such as different widths, heights, lengths, or cross-sectional areas, to produce different threshold voltages in different channel regions. The regions 14 with different $V_T$s and/or carrier densities are connected in parallel to form the composite device. The regions 14 may be separated from each other by non-conducting regions. In some embodiments, the conducting channels may be formed of heterostructure-NWs of small cross sectional dimensions, as illustrated in FIGS. 7A and 7B. FIG. 7A shows a perspective view and FIG. 7B shows a top view of such a transistor. Unlike the transistors of FIGS. 5 and 6, in the transistor of FIGS. 7A and 7B the widths w of the NW or fin structures vary across the width of the transistor. A first semiconductor region has a width $w_a$, a second semiconductor region has a width $w_b$, and a third semiconductor region has a width $w_c$, where $w_a < w_b < w_c$. The channels formed in these regions of different widths extend in parallel between the source S and the drain D. Due to the different widths, the regions have different threshold voltages and/or carrier densities. The total device current is the sum of the currents flowing in the individual regions 14. The drain current modulation is achieved through the gate metal which at least partially surrounds the regions 14 as shown in FIG. 7A.

Figure 8A:
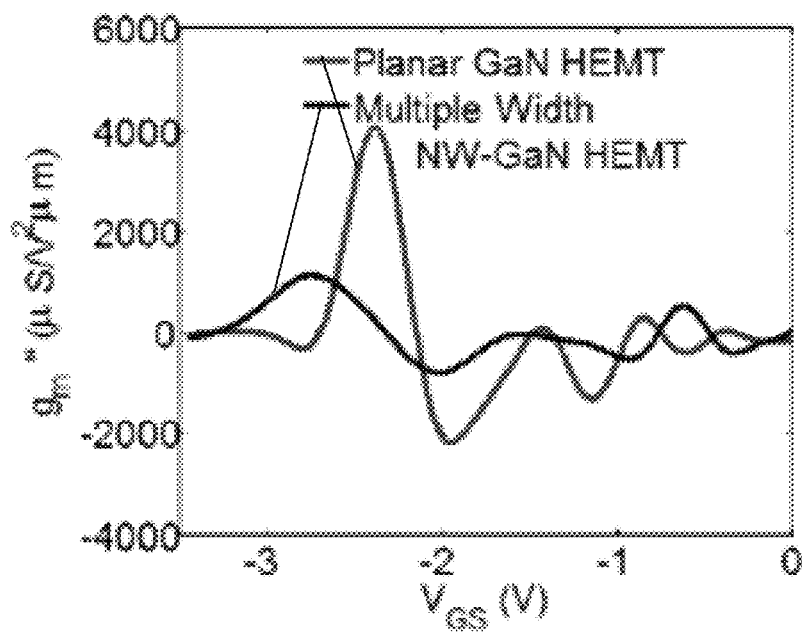
FIG. 8A shows a plot of $g''_m$ vs. $V_{gs}$ for a planar GaN HEMT having a nanowire configuration or a fin configuration with varying widths.
Figure 8B:
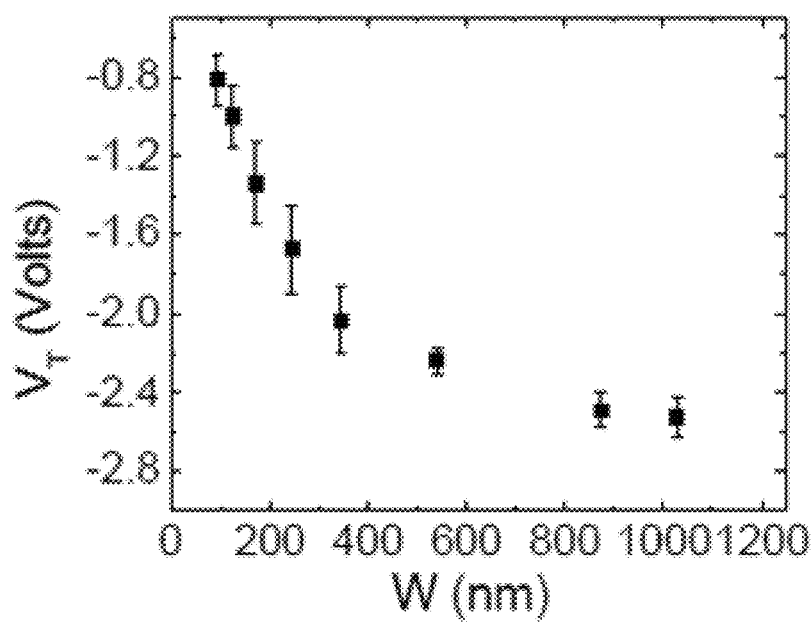
FIG. 8B shows a plot of $V_T$ vs width for such a transistor.

In contrast to the conventional planar GaN-HEMTs, the structure illustrated in FIGS. 7A and 7B, can overcome the linearity limitations. In comparison to a planar GaN-HEMT of the same effective width, the NW-GaNFET displays lower $g''_m$ at $V_{GS}$ around $V_T$ as seen in FIG. 8A due to smoother off-to-on transition in the NW-GaNFET gain ($g_m$) characteristics. This is because the $V_T$ of NW-GaN heterostructure varies with the width (W) of the NW as seen in FIG. 8B. This translates to a difference in the $V_T$ among multiple-width NWs forming the NW-GaNFET which cause the device-$g_m$ to exhibit a smoother transition from off-to-on state around $VGS=V_T$, hence yielding low $g''_m$ and large-signal IMD.

Although FIGS. 7A and 7B show a configuration in which the semiconductor regions 14 extend all the way between the source and the drain, the techniques described herein are not limited in this respect. The semiconductor regions 14 may only be present under the gate, or be present under the gate and extend a portion of the way across the source and/or drain access regions. In some embodiments, the dimensions of the semiconductor regions 14, such as the width, height or cross-sectional area may be different in one or more access regions than under the gate.

Engineering the Gate Region Stack

Another approach to obtain a $V_T$-engineered transistor structure is based on changing the gated region of the device to achieve $V_T$-offsets among constituent sub-transistors. Any of the techniques described herein for varying $V_T$ can be used to vary $V_T$ among different gate fingers, as shown in FIG. 14C. For example, gate fingers F1, F2, and F3 each may have a technique applied that results in different threshold voltages $V_T1$, $V_T2$, and $V_T3$, respectively. Alternatively or additionally, the threshold voltage may be varied across one or more gate fingers, as illustrated in FIG. 14D.

FIGS. 9A and 9B show a technique where the composition and/or doping concentration of the semiconductor regions is varied 14 between parallel channel regions. For example, the heterostructure composition (for example, x and/or y values in $Al_xIn_yGa_{1-x-y}N$ (x<1, y<1, x+y<1) may be varied across the gated region(s)) in the gated region may be varied among the sub-transistors. FIG. 9A shows a technique in which the semiconductor regions 14 of FIGS. 5 and 6 have varying composition to vary their threshold voltage). FIG. 9B shows an embodiment illustrating multiple gate fingers F1-F3, where the composition of the semiconductor material is different under each of the gate fingers F1-F3, as in the embodiment of FIG. 14C.

As another example, FIGS. 10A and 10B show that the thickness of the barrier region (e.g., $Al_xIn_yGa_{1-x-y}N$ (x<1, y<1, x+y<1) can be changed to achieve $V_T$ offsets. This can be done by selective thinning by top-down etching, or selective growth with appropriate growth masks, for example.

Another way to engineer the $V_T$-offsets is to shift the flatband voltage by changing the work-function of the gate metal among the constituent sub-transistors. This is shown in FIGS. 11A and 11B where the gate metal composition is changed for the different sub-transistors. This technique is applicable for both Schottky gate and oxide-gated transistors.

As another example, for $V_T$ engineering the equivalent oxide thickness (EOT) of the gate dielectric in oxide-gated transistors can be changed. This can be done by changing the dielectric thickness and/or composition and is illustrated in FIGS. 12A and 12B.

Another technique is to add additional capacitors in series to each individual (or group) of gate fingers. A semiconductor material 15 such as a p-type $Al_xIn_yGa_{1-x-y}N$ layer in the gate stack is commonly used method to achieve normally-off device operation. By varying the thickness and/or doping of this region, the $V_T$ can be offset amongst the various transistor elements. This is shown in FIGS. 13A and 13B.

In addition to these, other methodologies that change the effective gate capacitance and hence the $V_T$ of these elements which can reduce the $g''_m$ of the overall transistor are suitable techniques to fabricate a $V_T$ engineered device. Other metrics that affect $V_T$ could also be implemented to achieve $V_T$-offset. Approaches such as strain-engineering to change the polarization-charge offset ($\Delta\sigma$), changing effective gate-stack capacitance ($C_G$), metal-work function engineering ($\phi_B$) channel-doping to change the Fermi-level ($E_F$) can be adopted since they change $V_T$ of the multiple constituent transistor elements. Strain engineering can be implemented by different passivation materials/thickness on top of the gate-metal along the width-direction, different stressor layers (either beneath the channel or in S/D regions) or epi-layers. It is also possible to locally change the doping of some gate/channel regions by using fluorine plasma or ion implantation.

Any of the approaches mentioned above with fewer variations (of heterostructure thicknesses, metals or gate-stack variations) can be used and then broader distribution of $V_{TS}$ can be obtained by patterning those structures and changing the pitch between them. Any of the techniques described herein may be used in combination to vary $V_T$. In some embodiments, using such techniques in combination can achieve a larger $V_T$-offset range.

Figure 20A:
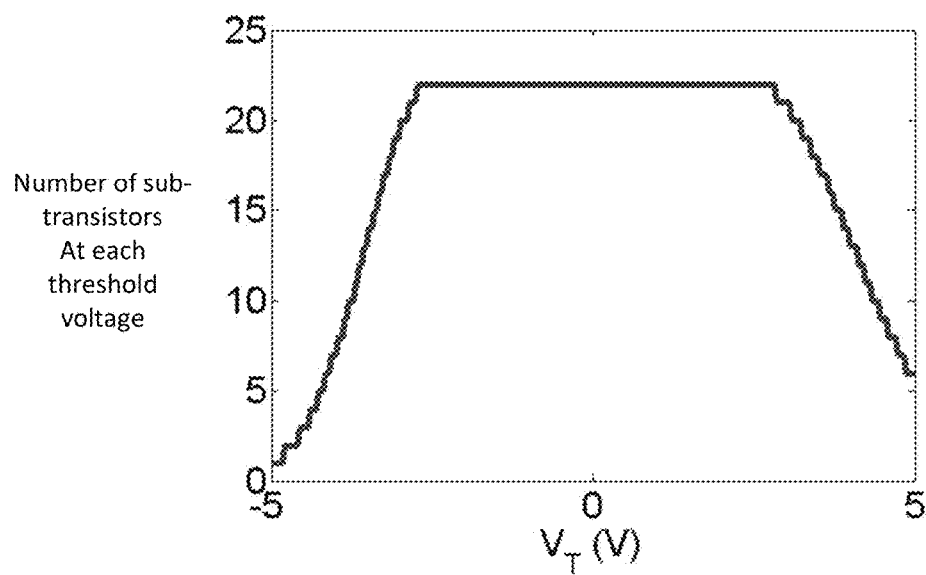
FIG. 20A shows a plot for one example in which the number of sub-transistors or gate controlled regions varies with threshold voltage.

Above have been described techniques for producing different threshold voltages in different regions of a transistor. Accordingly, a transistor may be produced having sub-transistors or gate-controlled regions with different threshold voltages. In some embodiments, the number of sub-transistors or gate controlled regions at each threshold voltage may be varied at different threshold voltages. For example, if the width of a fin is varied to produce different threshold voltages, as illustrated in FIGS. 7A and 7B, the number of fins at each width (and therefore threshold voltage) may be varied. However, any suitable technique can be varying the threshold voltage may be used. Varying the number of number of sub-transistors or gate controlled regions at each threshold voltage can help to reduce the $g_m$ derivatives, particularly the $g_m$ derivatives around the highest and lowest threshold voltages. FIG. 20A shows a plot for one example in which the number of sub-transistors or gate controlled regions varies with threshold voltage. The curve of FIG. 20A was selected to optimize the $g_m$ derivatives for this particular example. In this example, there may be twenty-two sub-transistors or gate controlled regions for each threshold voltage produced between −3V and +3V. The number of sub-transistors or gate controlled regions at each threshold voltage is gradually reduced with more extreme threshold voltages for threshold voltages below −3V and above+3V. This can help to reduce the size of the $g_m$ derivatives at the more extreme threshold voltages, due to the reduction in the number of sub-transistors or gate controlled regions at the more extreme threshold voltages. The curve illustrated in FIG. 20A is asymmetrical, which reflects the asymmetry in the $g_m$ derivatives for a single sub-transistor or gate-controlled region.

Figure 20B:
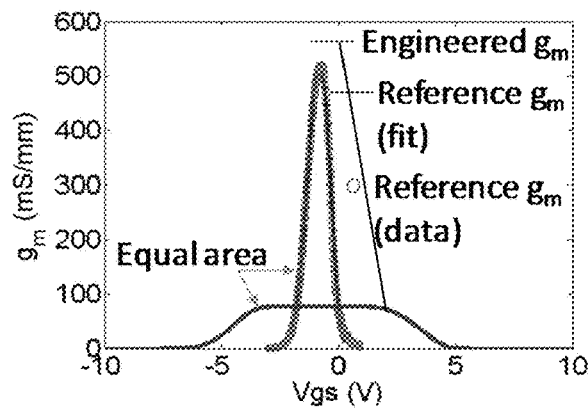
FIGS. 20B-20D show $g_m$, $g'_m$ and $g''_m$ for a device having variations in the number of sub-transistors or gate controlled regions as illustrated in FIG. 20A and a reference device.
Figure 20C:
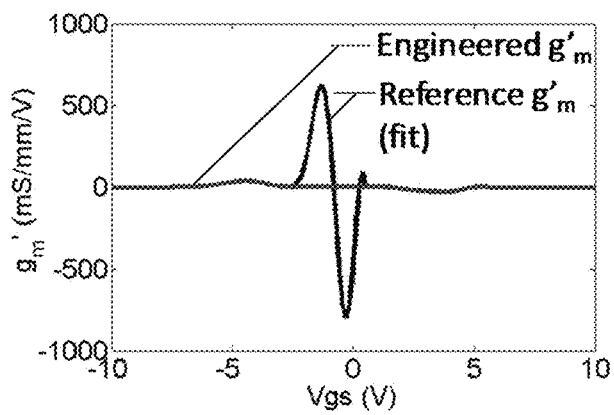
Figure 20D:
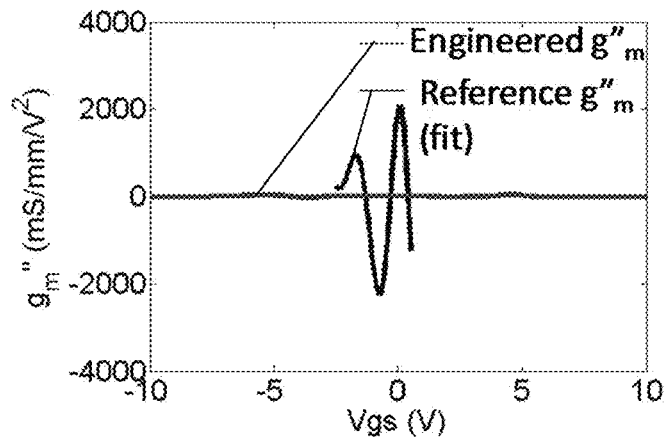

FIG. 20B shows $g_m$ for a device having variations in the number of sub-transistors or gate controlled regions at each threshold voltage as illustrated in FIG. 2A as well as for a reference design having a single sub-transistor or gate-controlled region. FIG. 20B illustrates that both devices have the same gain because they have the same area under the $g_m$ curve. FIGS. 20C and 20D show plots of $g'_m$ and $g''_m$ for both designs, and illustrates the a device having variations in the number of sub-transistors or gate controlled regions at each threshold voltage as illustrated in FIG. 2A has significantly lower values of $g'_m$ and $g''_m$.

Engineering the Access Regions

Figure 14A:
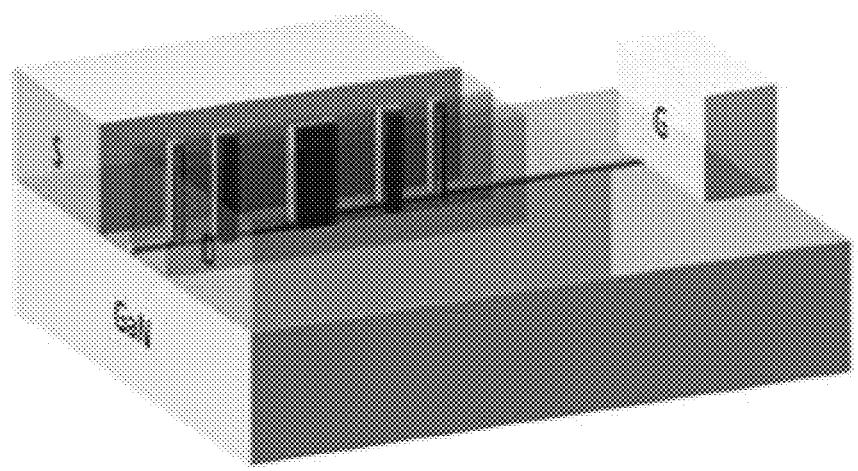
FIGS. 14A and 14B show an embodiment in which the multiple finger regions of the structure of FIGS. 7A and 7B may be formed only beneath the gate metal while the access regions remain as conventional planar GaN transistors.
Figure 14B:
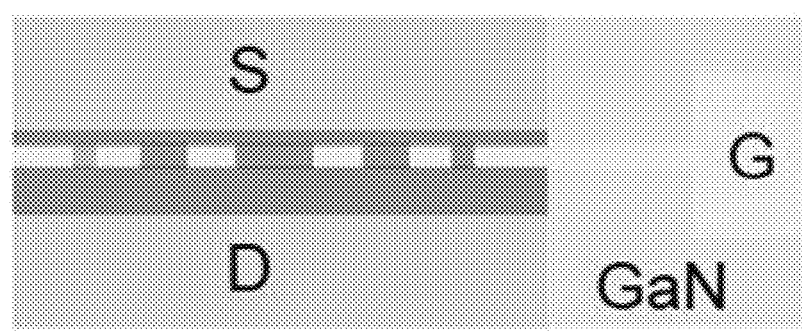
Figure 14C:
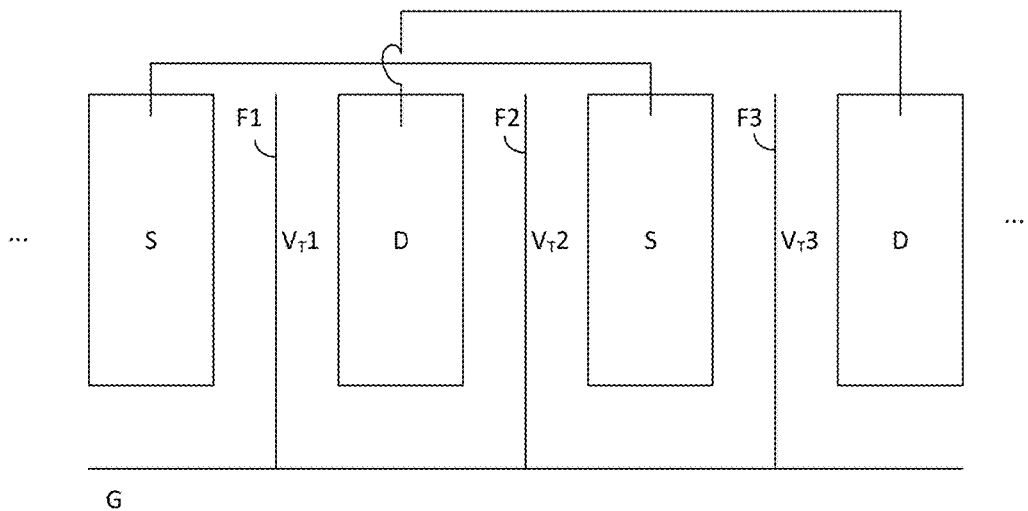
FIG. 14C shows a transistor having a plurality of gate fingers with different threshold voltages.
Figure 14D:
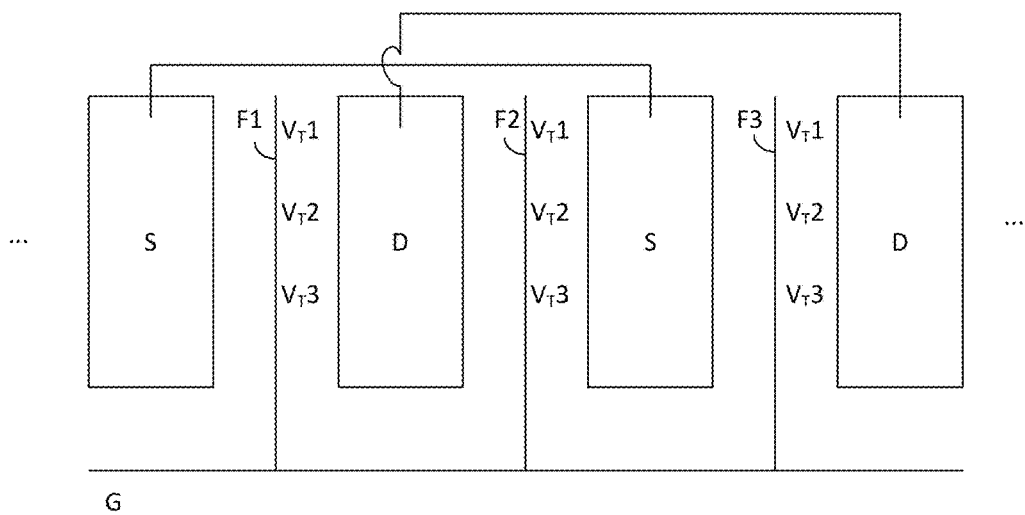
FIG. 14D shows the threshold voltage may be varied across one or more gate fingers.

As shown in FIGS. 14A and 14B, the multiple finger regions of the structure of FIGS. 7A and 7B may be formed only beneath the gate metal while the access regions remain as conventional planar GaN transistors. This design accomplishes a larger effective width for the access regions, which lowers their total resistance and their non-linear contribution to the device $g_m$ characteristics at high $V_{GS}$. The design combines the aforementioned advantage of low $g''_m$ around $V_{GS}=V_T$ along with improved linearity performance at high $V_{GS}$ or saturated power conditions (Psat). These multiple fingers in the gate region can be NWs that have different widths and/or can be engineered gate stack structures. The techniques highlighted above yield improved large-signal linearity performance of GaN-PAs in terms of lower harmonic content in the output-signal, higher Psat, higher OIP3 and lower IMD.

The channel of the devices described herein could be formed by either a top-down method or a bottom-up method. The techniques described herein can be applied to both normally-on (Depletion-mode) and normally-off (Enhancement-mode) transistors. The techniques discussed herein can be combined to achieve different variants of the design. In addition, the heterostructure can be removed altogether to form a truly metal-oxide-semiconductor field effect transistor (MOSFET) which can be either p-type or n-type. Other techniques such as recessed gate or implantation under the gate to achieve normally-off operation can be applied along with the $V_T$ offsetting and engineering approaches described here. The proposed structure can be implemented on any substrate by growth or layer transfer technology and for channels that are both N-face and Ga-face. The techniques and device structures described herein can also be applied to transistors made of other semiconductors such as silicon, GaAs, InGaAs, etc.

Vertical Transistors

The techniques described herein can also be used to improve the linearity of vertical transistors. For example, in the case of vertical transistors where the current is confined to vertical fins, the threshold voltage can be locally modulated by changing the width of the fins, the gate oxide thickness or any of the other techniques described in the previous sections. For example, in vertical GaN transistors based on nano-pillars, the threshold voltage in different regions can be changed by varying the width of the pillars. These techniques can also be applied to CAVET devices and other vertical transistors.

Example 1

Introduction

Described herein is a demonstration of a new technology to improve the linearity of GaN-based high electron mobility transistors (HEMTs) through device-level transconductance ($g_m$)-compensation. The increasing demand for mobile devices and internet of things (IoT) necessitates efficient wireless communication. GaN-based HEMTs are emerging as the ideal candidates that can address the surging demand for highly efficient, linear amplification of digitally modulated information to cater to applications such as 5G-LTE, WIMAX, Sat-Com, CAT-TV and radar. While GaN-HEMTs can yield superior output power (Pout), and power-added-efficiency (PAE), GaN-based power amplifiers (PAs) suffer from severe non-linearities. Non-linearities in the PA transistors result in significant side-bands, saturation of output power at high input powers, as well as signal distortion. In addition, the back-off in input power levels needed to meet typical linearity requirements significantly reduces the PAE of the amplifier.

Here, we demonstrate a device-level implementation using fin-like structures patterned and etched in the GaN-HEMT. The composite device includes variable-width-fins forming the channel between source and drain. Since the threshold-voltage ($V_T$) changes with fin-width, the composite device has parallel FET-elements with offset $V_T$s that reduce the composite $g_m$-derivatives and hence large-signal non-linearity. The device-level technique has the added advantage of achieving the linearity boost using a single gate-bias supply and reduced footprint unlike prior techniques. The composite fin-based device yields 2× reduction in $g_m$-derivatives and ~15 dB reduction in harmonic and inter-modulation-distortion (IMD) power. Further, we combine the nano-fin based $V_T$-engineering technique with effective source-drain self-alignment (by making the access regions wider than the gated-region-width) and achieve significant boost in device-linearity: 20 dB improvement in IMD and harmonic power, 6 dB in OIP3. The technique demonstrated in this work, when implemented on high-performance commercial GaN-HEMT technologies is projected to yield highly linear RF-GaN HEMTs with low signal distortion: POIP3/PDC=20 dB, OIP3=30 dBm with IMD below the distortion limit as projected using the MIT-Virtual Source GaNFET (MVSG) model, thus proving the potential of GaN-technology in advanced high-power, high-frequency RF and communication applications.

$g_m$-Compensation Technique: Principle of Operation

By connecting multiple FETs in parallel (common source and drain) with different gate-overdrive ($V_G$-$V_T$) quiescent bias voltages, the effective $g_m$ derivatives ($g'_m$ and $g''_m$) of the FET in the PA can be reduced. Since the key DC-device-transfer functions that correlate to the large signal non-linearity of the PA are the $g_m$ and its derivatives ($g'_m$ and $g''_m$), the technique can yield high-linearity PAs. FIG. 15A plots a typical $g_m$ vs. gate to source voltage ($V_{GS}$) for a standard AlGaN/GaN HEMT. There are two regions where $g'_m$ and $g''_m$ are high: (1) The off-to-on transition region $V_1 < V_{GS} < V_2$ and (2) the region $V_{GS} > V_2$. As seen in FIG. 15B, when an input signal $v_{in}$=A cos($\omega$t) at a frequency $\omega$ is applied to the input of a PA, the amplified signal consists of the fundamental output at $\omega$, which is proportional to $g_m$, $v_{out} \propto g_m A(\cos(\omega t))$ and additional higher frequency outputs, which are proportional to $g'_m$ and $g''_m$, at 2$\omega$ and 3$\omega$ as given in Eq. (1). The two-tone IMD signal is also proportional to $g''_m$ as given in Eq. (2).

$$v_{out2} \propto \frac{g'_m A^2 (1 + \cos(2\omega t))}{2}; v_{out3} \propto \frac{g''_m A^3 (3\cos(\omega t) + \cos(3\omega t))}{4} \quad (1)$$

$$IMD \propto \frac{g''_m A^3 (3\cos((2\omega_1 - \omega_2)t) + 3\cos((2\omega_2 - \omega_2)t))}{4} \quad (2)$$

These additional harmonic outputs are undesirable because they result in power loss from the PA. At the circuit-level, $g''_m$ can be reduced by connecting a set of transistors together with a slight offset in gate biases $V_{Gi}$ applied to them. The individual transistors will each have a characteristic $g''_m$ curve which will be offset by the same amount as the $V_{Gi}$ s, as seen in FIG. 15C (left). The successive peaks cancel each other when the transistors are connected together, resulting in a reduced composite $g''_m$ seen in FIG. 15C (right). At the device-level, a similar concept can be applied by having adjacent devices or device-elements within a single device with a slight offset in their threshold voltages ($V_{Ti}$), as seen in FIG. 15D.

High-Linearity Device Fabrication

Figure 16A:
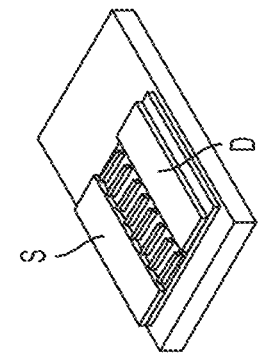
FIGS. 16A-H show a fabrication technique for a transistor having improved linearity.
Figure 16B:
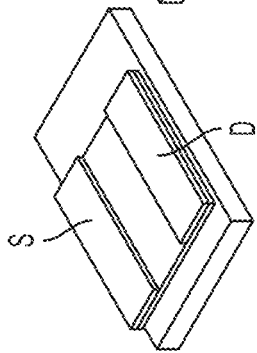
Figure 16E:
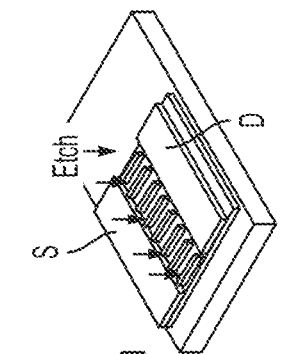
Figure 16F:
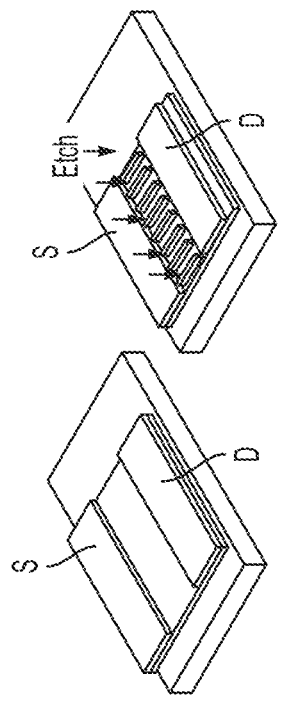
Figure 16C:
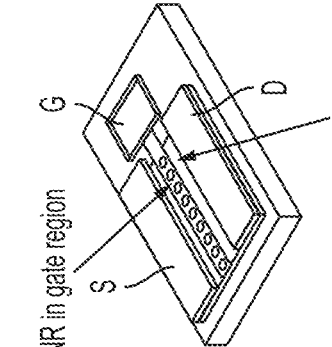
Figure 16D:
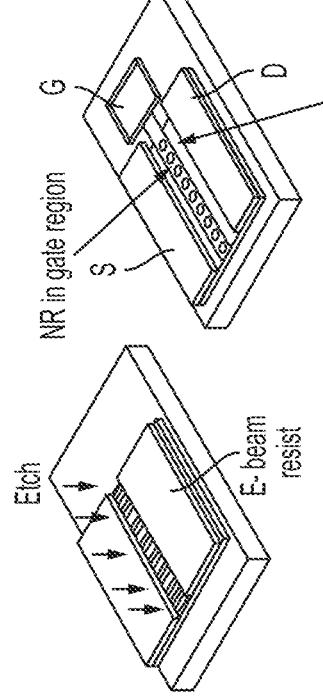
Figure 16G:
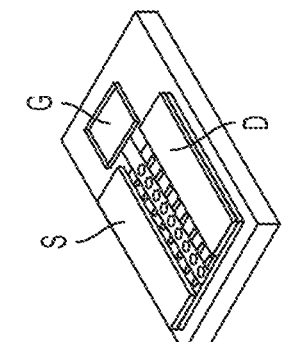
Figure 16H:
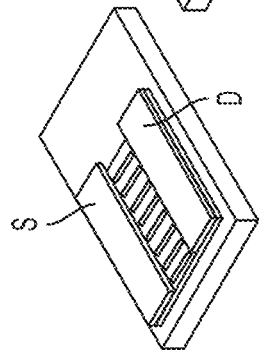

Two different types of fin-based devices for achieving high-linearity were fabricated in this work. In the type-I devices, the fin-structures were present in both the channel and access regions of the device. Source and drain ohmic contacts were first fabricated by patterning and depositing a Ti/Al/Ni/Au (200/1000/250/500 Å) metal stack on a nominal 23 nm Al$_{0.23}$Ga$_{0.77}$N/1 nm AN/1.2 µm GaN on SiC HEMT structure, supplied by IQE, followed by 30 s rapid thermal annealing at 800° C., as seen in FIG. 16A. Hydrogen silsesquioxane (HSQ) electron-beam resist was then used to pattern the fin structures between the source and drain contacts. With the HSQ-based SiOx hardmask, the fin structures were etched using a BCl3/Cl2 inductively coupled plasma (ICP) dry etch FIGS. 16B-C. Devices containing five different width fin-structures (ranging from ~150 to 450 nm) within a single device (called M-fin devices) were fabricated along with baseline devices consisting of a single width of the fin-structure (called S-fin devices) between the source and drain contacts. Both the S-fin and M-fin devices had the same total current carrying width. The gate length ($L_G$), gate-to-source ($L_{SG}$) and gate-to-drain ($L_{GD}$) spacing were 0.25-0.5, 1 and 3 µm respectively in all devices. After Ni/Au Schottky contact gate metallization (FIG. 16D), all devices were passivated with 60 nm of plasma-enhanced chemical vapor deposited SiNx. In the type-II devices, the fin structures of the devices were restricted to be present only in the gate (channel) region with the source and drain access regions remaining planar. After ohmic contact definition and HSQ patterning of the fin, as was done in the type I devices (FIGS. 16E-F), ZEP-520A electron beam resist was used to define the gate region of the device. This was followed by a BCl3/Cl2 ICP dry-etch (FIG. 16G). Here, the ZEP resist acts as a mask and prevents the source and drain access regions from being etched, whereas the HSQ pattern in the gate regions allows the fin-structures to be etched within the pre-defined gate region. Following this, the HSQ was removed by dilute HF acid and Ni/Au gate metal was deposited without any additional lithography, making the gate self-aligned with the fin (FIG. 16H). SiN$_x$ passivation was deposited as in the type-I devices.

Type-I Devices: DC and Linearity Characteristics

Figure 18:
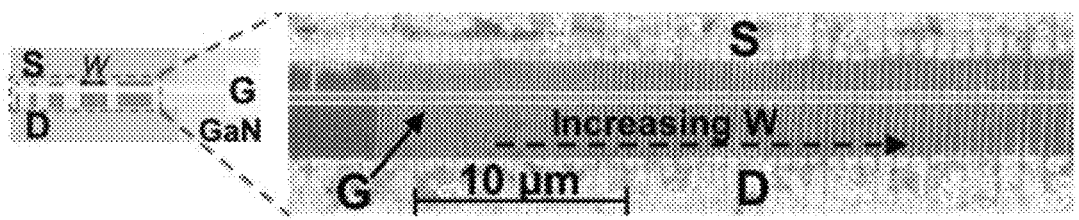
FIG. 18 illustrates a type-I M-fin device.

FIG. 17A shows the schematic and scanning electron microscope (SEM) image of a type-I S-fin device with the fin-structures extending from the source to the drain. Five different S-fin devices were fabricated such that their individual fin widths are different but the total conduction width is the same for all devices. As seen from the transfer curves in FIG. 17B, as the fin-width is reduced, the $V_T$ for these devices shifts towards zero. This is attributed to a larger impact of surface depletion and to the relaxation of the lattice stress and a consequent reduction in the 2DEG density in the AlGaN/GaN piezoelectric material system. In FIG. 17C, the $V_T$ (defined at drain current ID=1 mA/mm) is plotted as a function of the fin-width. The widths were designed such that the difference in $V_T$ between successive widths is about 0.2-0.3 V, which may be optimum for $g_m$-compensation. FIG. 18 shows the schematic and SEM image of a type-I M-fin device, in which fins of all the widths used for the S-fin devices are present between the source and drain contacts of a single device. The total width of the M-fin device is designed to be equal to an individual S-fin device.

Type-II Devices: DC and Linearity Characteristics

Figure 19:
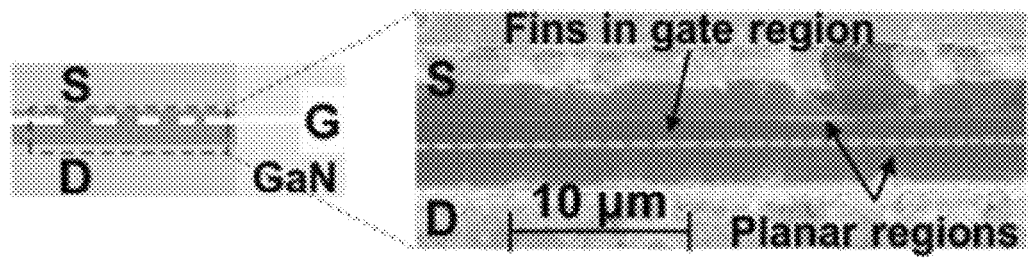
FIG. 19 shows a type-II M-fin device.

As mentioned before, some devices (type-II) were designed such that the fin structures are restricted to be within the gate region. This keeps the access regions of the device planar, thereby reducing access resistance of the device and prevents the $g_m$-degradation in the on-state (Region 2. the region $V_{GS} > V_2$ in FIG. 17A which is relevant for high-power near-Psat operation in PAs). Thus type-II devices are expected to be more linear in this region with a particular reduction in $g'_m$ and hence harmonic power. FIG. 19 shows the device schematic and SEM image of the type-II M-fin device, with fins of varying width present within the 250 nm length gate region, while the access regions remain planar.

Conclusions

This work illustrates the use of device-physics and system-level understanding to demonstrate a novel device-technique to achieve high-linearity in RF-GaN HEMTs. By eliminating access-regions and engineering device-transfer function ($g_m$ and its derivatives), a significant boost in large-signal non-linearity: 20 dB reduction in harmonics, OIP3 boost by 6 dB is shown. The full potential of this technique in providing IMD below the state-of-art is highlighted in commercial RF-devices using physical-MVSG model.

Example 2

This example reports on a new technology to improve the linearity of transistors via device-level transconductance ($g_m$) compensation. Fin-like structures are used to locally vary the threshold voltage ($V_T$) of the AlGaN/GaN high electron mobility transistors (HEMTs) and reduce the higher order derivatives of $g_m$ in the bias range of interest for device operation as a power amplifier (PA). The proposed technique achieves at the device level similar improvements as the circuit-level $g_m$ compensation technique, where several field effect transistors (FETs) are combined with different gate-overdrive voltages to lower the effective circuit-level $g_m$-derivatives. The $V_T$ of GaN HEMT transistors is modulated by fabricating fin structures in the channel and varying their widths. By adopting a transistor design with a combination of different fin widths (and hence different constituent $V_T$s), the off-to-on transition of $g_m$ in the subthreshold regime can be engineered to yield lower magnitudes of higher order derivatives of gm ($g'_m$ and $g''_m$). About 50-60% reduction in higher order $g_m$ derivatives is obtained, when compared with conventional planar devices. In-turn, this lowers the device-large-signal second- and third-order harmonic output power by about 15-25 dB, enabling improved linearity in PAs designed using this novel device.

Introduction

The recent proliferation of mobile devices along with the surge in the demand for internet-of-things (IoT) is increasing the need for efficient wireless data communication. Key emergent applications ranging from 5G-LTE, WIMAX, Sat-Com, CAT-TV, radar, space applications, D2D and other communication protocols in the range of L-band to millimeter-wave have to operate within stringent constraints on the spectral bandwidth as well as adjacent-channel interference. Non-linearities in the power amplifier (PA) transistors result in significant side-bands, and saturation of output power at high input powers.

To improve the amplifier linearity, the output power is typically backed-off, however this severely degrades the power-added-efficiency (PAE) in GaN amplifiers. The power consumed in base stations accounts for 56% of the total power consumed in a typical end-to-end cellular network and hence maintaining good linearity along with high PAE is critical. Common techniques to improve linearity (e.g. the use of pre-distortion circuits), in addition to increased system complexity, do not work at the highest operating band. This example demonstrates a device architecture that achieves better linearity performance while maintaining a similar PAE. The technique, while applicable to any FET, is demonstrated in this work by using GaN-based HEMTs.

Lateral AlGaN/GaN High Electron Mobility Transistors (HEMTs) are widely used in the PAs of cellular base stations. The AlGaN/GaN material system combines the high critical electric field of wide bandgap materials with the high mobility and electron density of a polarization-induced two dimensional electron gas, making it ideal for high power radio frequency (RF) amplification. However, AlGaN/GaN RF devices suffer from large-signal non-linearity, caused by the high electron mobility of the two dimensional electron gas (2DEG), and the increase in access region resistance at high gate voltages. This leads to early saturation of output power and gain compression. In this example, the non-linearity in the DC transconductance ($g_m$) of AlGaN/GaN HEMTs is improved by a device-level implementation of the "$g_m$-compensation method."

When an input signal $v_{in}$ with a frequency $\omega$ is applied to the input of a PA, the amplified signal consists of the fundamental output vout at $\omega$, and additional higher frequency outputs mostly at $2\omega$ and $3\omega$. These additional harmonic outputs are proportional to the first and second derivative of $g_m$, $g'_m$ and $g''_m$, and are undesirable because they result in power loss from the PA. In addition, the third-order intermodulation distortion (IMD-3) output, which is an important criterion for evaluating linearity, is proportional to $g''_m$. There are two regions where $g'_m$ and $g''_m$ are high: 1. The off-to-on transition region $V_1 < V_{GS} < V_2$, and 2. the region $V_{GS} > V_2$. The circuit level-$g_m$-compensation technique essentially reduces the magnitude of these derivatives by connecting in parallel (source and drain terminals connected together) transistors with an offset in their gate-overdrive voltages ($V_{GS}-V_T$). Different gate-overdrive voltages shift the $g_m$ vs. $V_{GS}$ characteristic on the voltage axis, causing the cancellation of the higher order derivatives in the effective $g_m$ of the parallel combination of FETs. Although it can improve the amplifier linearity, the traditional implementation of the $g_m$ compensation technique at the circuit level requires multiple biasing networks along with voltage sources which may not be desirable for a compact RF-MMIC implementation. Instead of using multiple gate-voltages to achieve the offset in the gate-overdrive voltages in the constituent FETs, we can use FETs with offsets in $V_T$ to achieve the same objective with a single gate-voltage bias supply. The effective $g''_m$ is then reduced for the combination of the five transistors, because the successive $g''_m$ peaks cancel each other due to the offset in the peaks and valleys of the different $g''_m$. In this example, in order to implement the $g_m$-compensation method at the device-level, we utilize AlGaN/GaN fin structures, in which the threshold voltage of the fin transistors varies with its width. The offsets in $g''_m$ are achieved within a single device by combining together fins of five different widths between the source and drain electrodes of the device, where the five widths are chosen such that the $V_T$ offset between successively higher widths is ~0.2-0.3 V.

Device Fabrication

Device fabrication started with the definition and metallization of a Ti/Al/Ni/Au (200/1000/250/500 Å) metal stack on a nominal 23 nm $Al_{0.23}Ga_{0.77}N$/1 nm AN/1.2 μm GaN on SiC HEMT structure, followed by 30s rapid thermal annealing at 800 degrees C. to form the source and drain ohmic contacts. Hydrogen silsesquioxane (HSQ) electron-beam resist was then used to pattern the fin structures between the source and drain contacts. With the HSQ-based SiOx hardmask, the fin structures were etched using a BCl3/Cl2 inductively coupled plasma dry etch. Two types of devices were fabricated—those with fins of a single width between the source and drain (S-fin devices), and those with five different fin widths between the source and drain (multiple width or M-fin devices). Both the S-fin and M-fin devices have the same total current carrying width (30 μm conductive width with 70 μm of total etched width between the fins). Standard planar devices were also fabricated on the same wafer for comparison. The gate length, gate-to-source and source-to-drain spacing were 0.5, 1 and 3 μm respectively in all devices. After Ni/Au Schottky contact gate metallization, all devices were passivated with 60 nm of plasma-enhanced chemical vapor deposited SiNx. The $V_T$ (defined at drain current ID=1 mA/mm) of the M-fin device ($V_T$=−2.76 V) is more positive than the planar device ($V_T$=−3.42 V) due to channel 2DEG-depletion in the fin structure. Furthermore, the output characteristics show similar output currents for the M-fin device, in comparison to the planar device.

Results and Discussion

Table I compares the various device properties of the fin-like devices with a planar device. It can be seen that the fin-formation leads to a higher on resistance and lower breakdown voltage, however the $f_T$ is comparable, while the $f_{max}$ is larger for the planar device. This might indicate increased gate resistance due to the fin (and hence sidewall gate metal) formation.

TABLE I

COMPARISON OF DEVICE PROPERTIES

| Quantity | Planar | M-fin | S-fin |
| --- | --- | --- | --- |
| $L_G$ | 500 nm | 500 nm | 500 nm |
| $I_{on}$ max. | 609 mA/mm | 468 mA/mm | 526.67 mA/mm |
| $R_{on}$ | 4.76 Ω-mm | 9.09 Ω-mm | 9.52 Ω-mm |
| $f_T$ | ~8 GHz | ~7 GHz | ~7 GHz |
| $f_{max}$ | ~40 GHz | ~25 GHz | ~25 GHz |
| BV | 78 V | 62 V | 66 V |

Conclusions

In this example, the slope of the $g_m$ vs. $V_{GS}$ curve is engineered in order to obtain lower $g'_m$ and $g''_m$ in the off-to-on transition region, which leads to lower harmonic outputs under Class AB-Class C amplifier operation. This $g_m$-compensation was demonstrated at the device level using fin structures, in which the $V_T$ is modulated by changing the fin width. Fins of five different widths were combined between the source and drain electrodes to form a single composite device. This allows the slope of the $g_m$ vs. VGS curve to be lower, giving a gentler rise of $g_m$ in the off-to-on transition of the device. The resulting $g'_m$ and $g''_m$ were reduced by more than 50% in this device, in comparison to a S-fin device. The $V_T$-engineered device also exhibited a reduction in large-signal harmonic output power content of 15 dB, which is a significant boost in the linearity performance of the amplifier.

Additional Aspects

Aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. For example, an apparatus, structure, device, layer, or region recited as "including," "comprising," or "having," "containing," "involving," a particular material is meant to encompass at least the material listed and any other elements or materials that may be present. The partially open-ended phrase "consisting essentially of" is meant to encompass essentially the material listed and does not preclude the presence of relatively small quantities of other materials, including the presence of dopants.

The terms "layer" and "region" are used interchangeably herein. Use of one term as opposed to the other is not meant to connote any difference in the shape, structure or method of fabricating the referenced "layer" or "region."

What is claimed is:

1. A transistor, comprising:
   at least one gate;
   a first gate-controlled region having a first threshold voltage, wherein the first gate-controlled region comprises at least one first semiconductor region controlled by the at least one gate, wherein the at least one first semiconductor region is between respective portions of the at least one gate; and
   a second gate-controlled region in parallel with the first gate-controlled region, the second gate-controlled region having a second threshold voltage different form the first threshold voltage, wherein the second gate-controlled region comprises at least one second semiconductor region controlled by the at least one gate, wherein the at least one second semiconductor region is between respective portions of the at least one gate,
   wherein the at least one first semiconductor region and the at least one second semiconductor region have different dimensions.

2. The transistor of claim 1, wherein the transistor is a field effect transistor.

3. The transistor of claim 2, wherein the field effect transistor is a high electron mobility transistor (HEMT).

4. The transistor of claim 2, wherein the transistor comprises a III-V semiconductor material.

5. The transistor of claim 1, further comprising:
   a source; and
   a drain;
   wherein the first and second gate-controlled regions are in parallel between the source and the drain.

6. The transistor of claim 1, wherein the first gate-controlled region and the second gate-controlled region have different widths.

7. The transistor of claim 6, wherein the at least one first semiconductor region comprises at least one III-V semiconductor material.

8. The transistor of claim 7, wherein the at least one first semiconductor region comprises a barrier layer of a first III-V semiconductor material and a region of a second III-V semiconductor material different from the first III-V semiconductor material.

9. The transistor of claim 1, wherein the first gate-controlled region and the second gate-controlled region have different compositions.

10. The transistor of claim 1, wherein the first gate-controlled region has a first barrier region and the second gate-controlled region has a second barrier region, wherein the first and second barrier regions have different thicknesses.

11. The transistor of claim 1, wherein the first gate-controlled region is controlled by a first gate region having a first gate material and the second gate-controlled region is controlled by a second gate region having a second gate material different from the first gate material.

12. The transistor of claim 1, further comprising a first gate dielectric overlying the first gate-controlled region and a second gate dielectric overlying the second gate-controlled region.

13. The transistor of claim 12, wherein the first and second gate dielectrics have different thicknesses and/or compositions.

14. The transistor of claim 1, wherein the first gate-controlled region is controlled by a first gate region and the second gate-controlled region is controlled by a second gate region, and the transistor further comprises a first material overlying the first gate region and a second material overlying the second gate region, the first and second materials having different compositions, doping concentrations and/or thicknesses.

15. The transistor of claim 1, wherein the first gate-controlled region is controlled by a first gate finger and the second gate-controlled region is controlled by a second gate finger.

16. The transistor of claim 15, wherein the transistor comprises a plurality of source and drain regions.

17. The transistor of claim 1, wherein the first and second threshold voltages are offset from one another to reduce $g''_m$.

18. The transistor of claim 1, further comprising a third gate-controlled region having a third threshold voltage different from the first threshold voltage and the second threshold voltage.

19. The transistor of claim 18, wherein the first and second threshold voltages are offset from one another by 0.1-2V and the second and third threshold voltages are offset from one another by 0.1-2V.

20. The transistor of claim 1, wherein the first gate-controlled region and the second gate-controlled region have different lengths.

21. The transistor of claim 1, wherein the first gate-controlled region and the second gate-controlled region have different heights.

22. The transistor of claim 1, wherein the first gate-controlled region and the second gate-controlled region have different cross-sectional areas.

23. A circuit, comprising:
a first transistor having a first threshold voltage, the first transistor having a first gate-controlled region; and
a second transistor in parallel with the first transistor, the second transistor having a second threshold voltage different from the first threshold voltage, the second transistor having a second gate-controlled region,
wherein the first gate-controlled region and the second gate-controlled region have channels of different dimensions between respective portions of at least one gate.

24. A method of forming a transistor, comprising:
forming a first gate-controlled region having a first threshold voltage; and
forming a second gate-controlled region in parallel with the first gate-controlled region, the second gate-controlled region having a second threshold voltage different from the first threshold voltage,
wherein the first gate-controlled region and the second gate-controlled region have channels of different dimensions between respective portions of at least one gate.

* * * * *